(12) United States Patent
Sato et al.

(10) Patent No.: US 11,709,192 B2
(45) Date of Patent: Jul. 25, 2023

(54) ELECTROMAGNETIC ENVIRONMENT ANALYSIS SYSTEM, ELECTROMAGNETIC ENVIRONMENT ANALYSIS METHOD, AND NON-TRANSITORY COMPUTER-READABLE MEDIUM

(71) Applicant: TDK CORPORATION, Tokyo (JP)

(72) Inventors: Shunya Sato, Tokyo (JP); Tatsuya Hayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/527,326

(22) Filed: Nov. 16, 2021

(65) Prior Publication Data

US 2022/0155356 A1  May 19, 2022

(30) Foreign Application Priority Data

Nov. 18, 2020 (JP) ................. 2020-191886

(51) Int. Cl.
*G01R 29/08* (2006.01)
*G06T 7/73* (2017.01)
*G06T 11/00* (2006.01)

(52) U.S. Cl.
CPC ............ *G01R 29/0892* (2013.01); *G06T 7/73* (2017.01); *G06T 11/00* (2013.01); *G06T 2207/30204* (2013.01)

(58) Field of Classification Search
CPC ....... G01R 29/0892; G06T 7/73; G06T 11/00; G06T 2207/30204
See application file for complete search history.

(56) References Cited

U.S. PATENT DOCUMENTS

| 2010/0280778 A1* | 11/2010 | Ohta | G06F 30/23 702/66 |
| 2011/0125429 A1* | 5/2011 | Kazama | G01R 29/0871 702/57 |
| 2015/0029190 A1* | 1/2015 | Ishida | G01J 3/443 345/420 |
| 2015/0293162 A1* | 10/2015 | Tsukamoto | G01R 29/0892 702/75 |

(Continued)

FOREIGN PATENT DOCUMENTS

JP  2013-238581 A  11/2013

*Primary Examiner* — Yu Chen
(74) *Attorney, Agent, or Firm* — Oliff PLC

(57) ABSTRACT

In an electromagnetic environment analysis system, an image creation unit creates an image for displaying information relevant to a measurement value in a position associated with a measurement position of each of the measurement values. A partition judgment unit judges a partition corresponding to the measurement position of each of the measurement values in a plurality of partitions forming a display range of the information relevant to the measurement value in the image, based on position information. A display information determination unit determines information relevant to the display of the partition, based on the measurement value corresponding to the partition. In a case where two or more measurement values measured at timings different from each other correspond to one partition, the display information determination unit calculates a representative value from the two or more measurement values, and determines information to be displayed in the partition, based on the representative value.

15 Claims, 18 Drawing Sheets

(56) References Cited

U.S. PATENT DOCUMENTS

2017/0370978 A1* 12/2017 Basu ..................... H04W 4/023
2020/0371146 A1* 11/2020 Hochwald .......... G01R 29/0892
2020/0404130 A1* 12/2020 Talbert ................. A61B 5/4893

* cited by examiner

*Fig.6A*

|  | X COORDINATE | Y COORDINATE | PARTITION NUMBER |
|---|---|---|---|
| PARTITION 1 | 1~10 | 1~10 | 1 |
| PARTITION 2 | 11~20 | 1~10 | 2 |
| PARTITION 3 | 21~30 | 1~10 | 3 |
| ... | ... | ... | ... |
| PARTITION 100 | 91~100 | 91~100 | 100 |

|  | X COORDINATE | Y COORDINATE |
|---|---|---|
| PARTITION 1 | 1~5 | 1~5 |
| PARTITION 2 | 6~10 | 1~5 |
| PARTITION 3 | 11~15 | 1~5 |
| ... | ... | ... |
| PARTITION 400 | 96~100 | 96~100 |

72

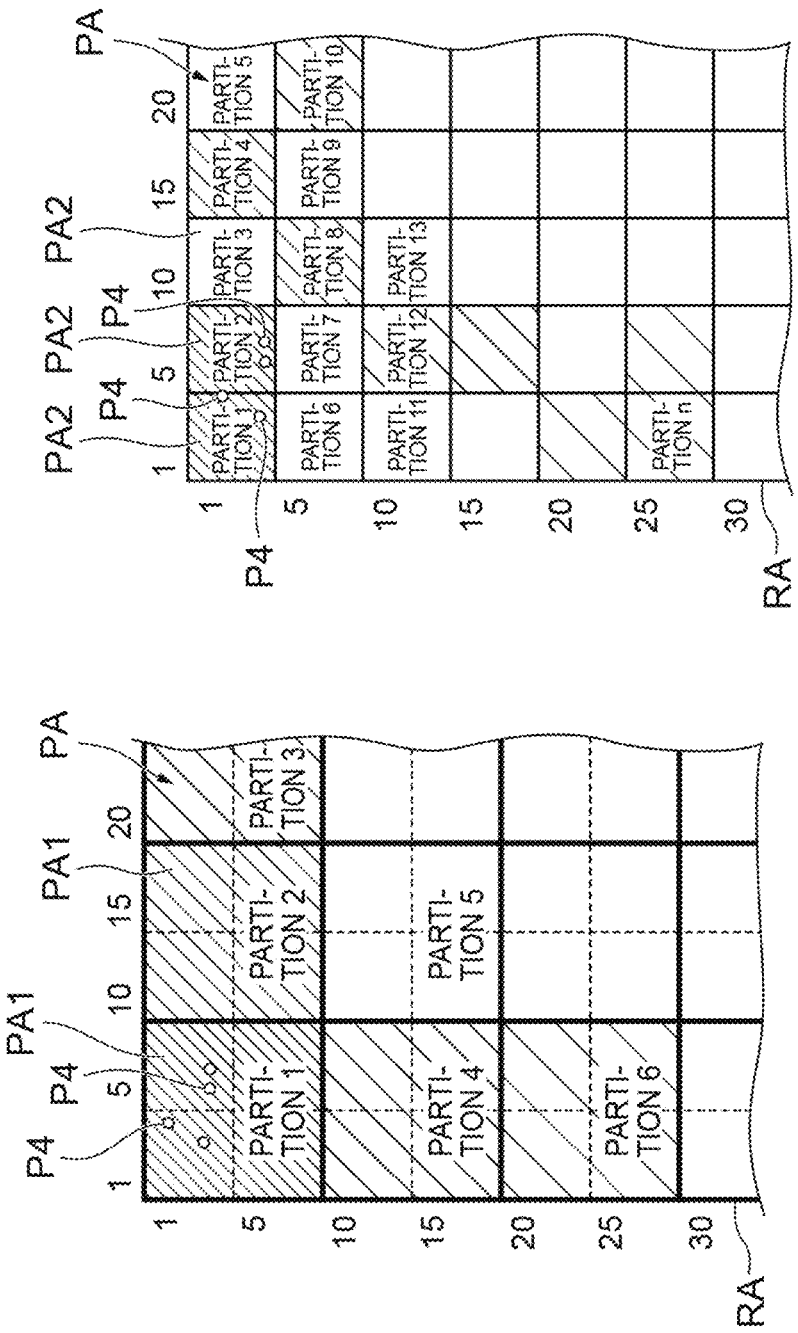

Fig.8

| MEASUREMENT INFORMATION | X COORDINATE | Y COORDINATE | MEASURE-MENT VALUE | PARTITION |
|---|---|---|---|---|
| D1 | 1 | 2 | 10 | 1 |
| D2 | 2 | 3 | 8 | 1 |
| D3 | 4 | 8 | 12 | 1 |
| D4 | 15 | 10 | 2 | 2 |
| ... | ... | ... | ... | ... |

ELECTROMAGNETIC ENVIRONMENT ANALYSIS SYSTEM, ELECTROMAGNETIC ENVIRONMENT ANALYSIS METHOD, AND NON-TRANSITORY COMPUTER-READABLE MEDIUM

TECHNICAL FIELD

The present invention relates to an electromagnetic environment analysis system, an electromagnetic environment analysis method, and a non-transitory computer-readable medium.

BACKGROUND

A known device analyzes an electromagnetic environment. For example, Japanese Unexamined Patent Publication No. 2013-238581 discloses a device that acquires a measurement value relevant to an electromagnetic environment and displays information relevant to the measurement value. Such a device associates the information relevant to the acquired measurement value with a plurality of partitions to which a display range is sectioned, and displays the information relevant to the measurement value for each of the partitions.

The electromagnetic environment is analyzed for various purposes. For example, in an electromagnetic compatibility (EMC) test of an electronic device, it is analyzed where on the device electromagnetic waves are generated. In the device described in Japanese Unexamined Patent Publication No. 2013-238581, a signal generated from a target to be measured is measured by moving a sensor. The measurement value that is measured is associated with each of the plurality of partitions to which a display range of a display unit is sectioned, in accordance with a position in which the measurement value is measured. A measurement result is represented by a color based on the measurement value for each of the partition.

The definition of the display of the information relevant to the measurement value decreases as the size of the plurality of partitions to which the display range is sectioned increases. In a case where the definition of the display is low, information relevant to a local electromagnetic environment is not obtained. In a case where a user performs the measurement while looking at the display, in a state where the definition of the display is low, it is also difficult to recognize whether or not the measurement value is acquired at a desired density. In contrast, it takes time and effort to grasp the overall situation of the electromagnetic environment, and the amount of data of the measurement result also increases, as the size of the plurality of partitions to which the display range is sectioned decreases. A suitable configuration of the plurality of partitions is changed in accordance with a measurement situation. In a case where the display range is sectioned with a constant size, it is difficult to solve the problems described above, which are in a trade-off relationship. For example, there is also a demand for displaying the measurement result in a broad position in the initial step of the measurement, and then, displaying a detailed measurement result for a desired position.

SUMMARY

An object of one aspect of the present invention is to provide an electromagnetic environment analysis system in which it is possible to easily attain desired measurement. An object of another aspect of the present invention is to provide an electromagnetic environment analysis method in which it is possible to easily attain desired measurement. An object of still another aspect of the present invention is to provide a program in which it is possible to easily attain desired measurement.

An electromagnetic environment analysis system of one aspect of the present invention includes a measurement information acquisition unit, a position information acquisition unit, and an image creation unit. The measurement information acquisition unit is configured to acquire a plurality of measurement values relevant to an electromagnetic environment. The position information acquisition unit is configured to acquire position information relevant to a measurement position in which each of the measurement values is measured. The image creation unit is configured to create an image for displaying information relevant to the measurement value in a position associated with the measurement position of each of the measurement values. The image creation unit includes a partition setting unit, a partition judgment unit, a display information determination unit, and a resetting judgment unit. The partition setting unit is configured to set a plurality of partitions forming a display range of the information relevant to the measurement value in the image. The partition judgment unit is configured to judge a partition corresponding to the measurement position of each of the measurement values in the plurality of partitions, based on the position information. The display information determination unit is configured to determine information relevant to the display of the partition, based on the measurement value corresponding to the partition. The resetting judgment unit is configured to judge whether or not to reset the plurality of partitions. In a case where the resetting judgment unit judges to reset the plurality of partitions, the partition setting unit resets the plurality of partitions forming the display range from a plurality of first partitions to a plurality of second partitions, each of which has a size smaller than the size of the first partition. The display information determination unit determines information relevant to the display of the second partition.

In such an electromagnetic environment analysis system, the resetting judgment unit judges whether or not to reset the plurality of partitions. In a case where the resetting judgment unit judges to reset the plurality of partitions, the partition setting unit resets the plurality of partitions forming the display range to the plurality of second partitions smaller than the first partition. In this case, the display information determination unit determines the information relevant to the display of the second partition. Accordingly, the size of the plurality of partitions forming the display range can be changed during the measurement of the display range. Therefore, the definition of the display can be changed in accordance with a measurement situation. As a result thereof, desired measurement can be easily attained.

In the one aspect described above, the size of each of the second partitions may be smaller than the size of each of the first partitions. In this case, the definition of the display can be in a high state from a low state during the measurement of the display range. Accordingly, the electromagnetic environment analysis system is capable of displaying a measurement result in a broad position in the initial step of the measurement, and then, displaying a detailed measurement result for a desired position.

In the one aspect described above, in a case where the resetting judgment unit judges to reset the plurality of partitions, the partition judgment unit may judge the second partition corresponding to the measurement position of each of the measurement values in the plurality of second partitions, based on the position information, and the display information determination unit may determine the information relevant to the display of the second partition, based on the measurement value corresponding to the second partition. In this case, since the measurement value corresponding to the second partition is judged again, more accurate display can be attained in the second partition.

In the one aspect described above, in a case where at least one of a plurality of conditions is satisfied, the resetting judgment unit may judge to reset the plurality of partitions. The size of each of the second partitions reset by the partition setting unit in a case where a first condition of the plurality of conditions is satisfied may be smaller than the size of each of the second partitions reset by the partition setting unit in a case where a second condition of the plurality of conditions is satisfied. In this case, the plurality of partitions of the display range are reset to the second partitions having different sizes, in accordance with the condition. Accordingly, desired measurement can be more easily attained.

In the one aspect described above, the second condition is a condition that is satisfied before the first condition is satisfied. In this case, the size of the plurality of partitions forming the display range is reset by satisfying the second condition, and then, the size of the plurality of partitions forming the display range is further reduced by satisfying the first condition. Therefore, the definition of the display can be changed at a multi-stage, in accordance with the measurement situation.

In the one aspect described above, the electromagnetic environment analysis system may further include a storage unit storing a plurality of partition definition tables for defining the configurations of each of the partitions in cases where the display range is sectioned to the numbers different from each other. The partition setting unit may set the plurality of partitions, based on the plurality of partition definition tables. In this case, the definition of the display can be more easily changed by the partition definition table, without any special calculation processing.

In the one aspect described above, the resetting judgment unit may judge to reset the plurality of partitions, in accordance with an input manipulation of a user. In this case, the plurality of partitions can be reset at an arbitrary timing.

In the one aspect described above, in a case where the number of partitions corresponding to the measurement value is greater than a predetermined number, the resetting judgment unit may judge to reset the plurality of partitions. In this case, the plurality of partitions can be automatically reset.

In the one aspect described above, in a case where a ratio of the number of partitions corresponding to the measurement value to the number of sectioned display ranges is greater than a predetermined value, the resetting judgment unit may judge to reset the plurality of partitions. In this case, the plurality of partitions can be automatically reset by simpler setting.

In the one aspect described above, in a case where the number of times of the resetting of the plurality of partitions is greater than a predetermined number, the resetting judgment unit may inhibit the resetting of the plurality of partitions. In this case, a situation in which the resetting is performed more than necessary can be avoided. As a result thereof, detailed measurement in a desired position can be more easily attained.

In the one aspect described above, the electromagnetic environment analysis system may further include a manipulation unit that includes a sensor sequentially detecting information relevant to the electromagnetic environment and is manipulated by the user. The measurement information acquisition unit may acquire the plurality of measurement values, based on the information detected in the sensor.

In the one aspect described above, the electromagnetic environment analysis system may further include a display unit configured to display the image created by the image creation unit.

An electromagnetic environment analysis method of another aspect of the present invention includes acquiring a plurality of measurement values relevant to an electromagnetic environment, acquiring position information relevant to a measurement position in which each of the measurement values is measured, and creating an image for displaying information relevant to the measurement value in a position associated with the measurement position of each of the measurement values. In the creation of the image, a plurality of partitions forming a display range of the information relevant to the measurement value is set in the image, a partition corresponding to the measurement position of each of the measurement values in the plurality of partitions is judged based on the position information, information relevant to the display of the partition is determined based on the measurement value corresponding to the partition, and whether or not to reset the plurality of partitions is judged. In a case where it is judged to reset the plurality of partitions, the plurality of partitions forming the display range are reset from a plurality of first partitions to a plurality of second partitions, each of which has a size different from the size of the first partition, and information relevant to the display of the second partition is determined.

A non-transitory computer-readable medium storing a program of still another aspect of the present invention allows a computer to execute acquiring a plurality of measurement values relevant to an electromagnetic environment, acquiring position information relevant to a measurement position in which each of the measurement values is measured, and creating an image for displaying information relevant to the measurement value in a position associated with the measurement position of each of the measurement values. In the creation of the image, a plurality of partitions forming a display range of the information relevant to the measurement value is set in the image, a partition corresponding to the measurement position of each of the measurement values in the plurality of partitions is judged based on the position information, information relevant to the display of the partition is determined based on the measurement value corresponding to the partition, and whether or not to reset the plurality of partitions is judged. In a case where it is judged to reset the plurality of partitions, the plurality of partitions forming the display range are reset from a plurality of first partitions to a plurality of second partitions, each of which has a size different from the size of the first partition, and information relevant to the display of the second partition is determined.

One aspect of the present invention provides an electromagnetic environment analysis system in which it is possible to easily attain desired measurement. Another aspect of the present invention provides an electromagnetic environment analysis method in which it is possible to easily attain desired measurement. Still another aspect of the present invention provides a non-transitory computer-readable medium storing a program in which it is possible to easily attain desired measurement.

BRIEF DESCRIPTION OF THE DRAWINGS

FIGS. 6A and 6B are diagrams illustrating a partition definition table that is used in setting of the partition.

FIGS. 7A and 7B are diagrams for describing the setting of the partition.

FIG. 8 is a diagram for describing judgment of the partition.

DETAILED DESCRIPTION

Figure 1:
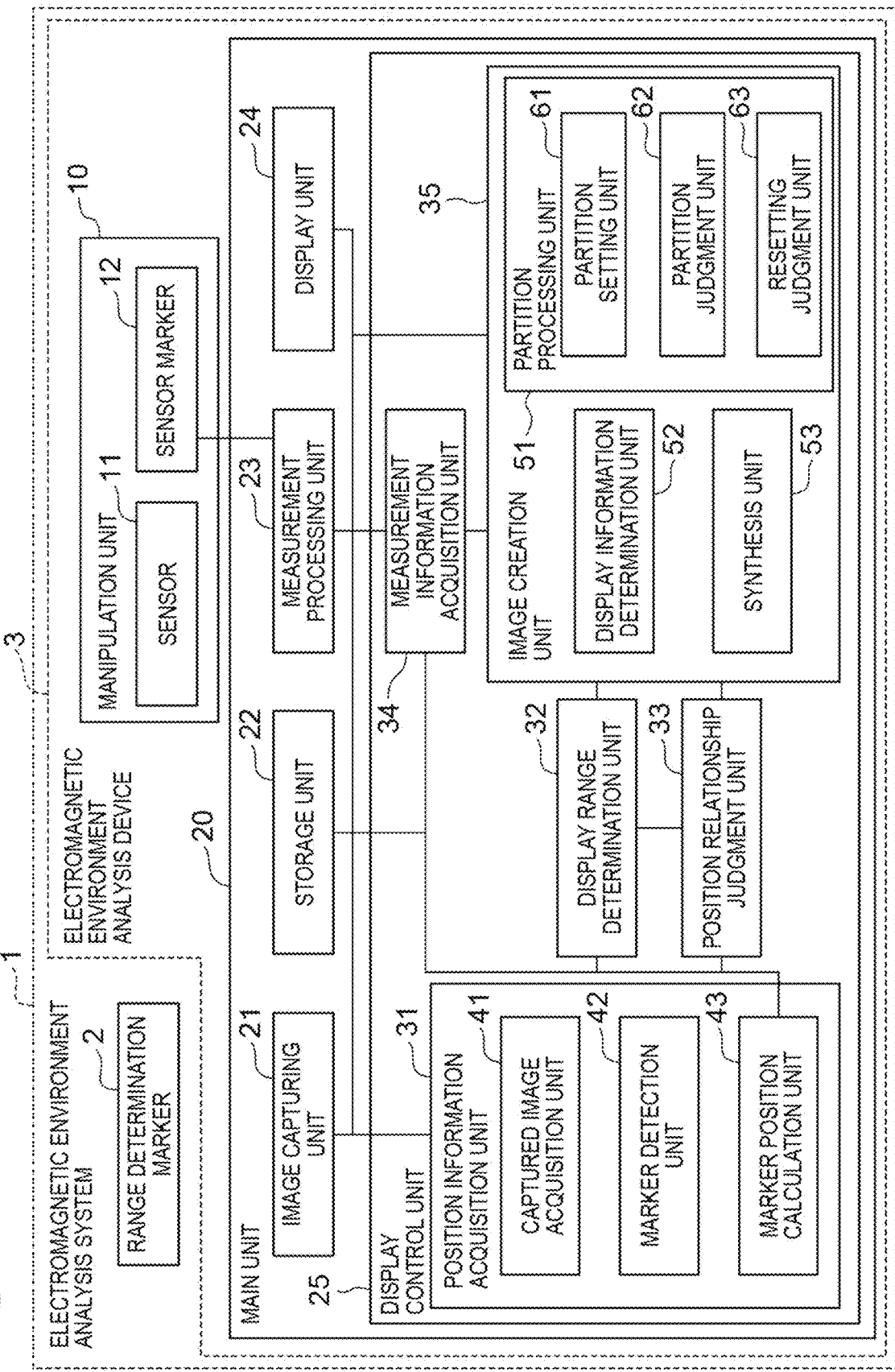
FIG. 1 is a block diagram of an electromagnetic environment analysis system in this embodiment.

Hereinafter, an embodiment of the present invention will be described in detail with reference to the attached drawings. In the description of the drawings, the same reference numerals will be used in the same or equivalent constituents, and the repeated description will be omitted.

First, the function and the configuration of an electromagnetic environment analysis system in this embodiment will be described with reference to FIG. 1 to FIG. 10. FIG. 1 is a block diagram of the electromagnetic environment analysis system. An electromagnetic environment analysis system 1 is a system that performs measurement relevant to an electromagnetic environment and displays a measurement result as an image. The electromagnetic environment analysis system 1 measures an electromagnetic field, as the measurement relevant to the electromagnetic environment. The electromagnetic environment analysis system 1, for example, measures an electromagnetic field generated by a measurement target. The electromagnetic field, for example, is generated by an electromagnetic wave propagating from the measurement target. The electromagnetic field is not limited to an electromagnetic field generated by an electromagnetic wave at an infrasonic frequency. The measurement of the electromagnetic field includes the measurement of the electromagnetic wave. Hereinafter, the measurement relevant to the electromagnetic environment will also be simply referred to as "measurement".

Figure 2:
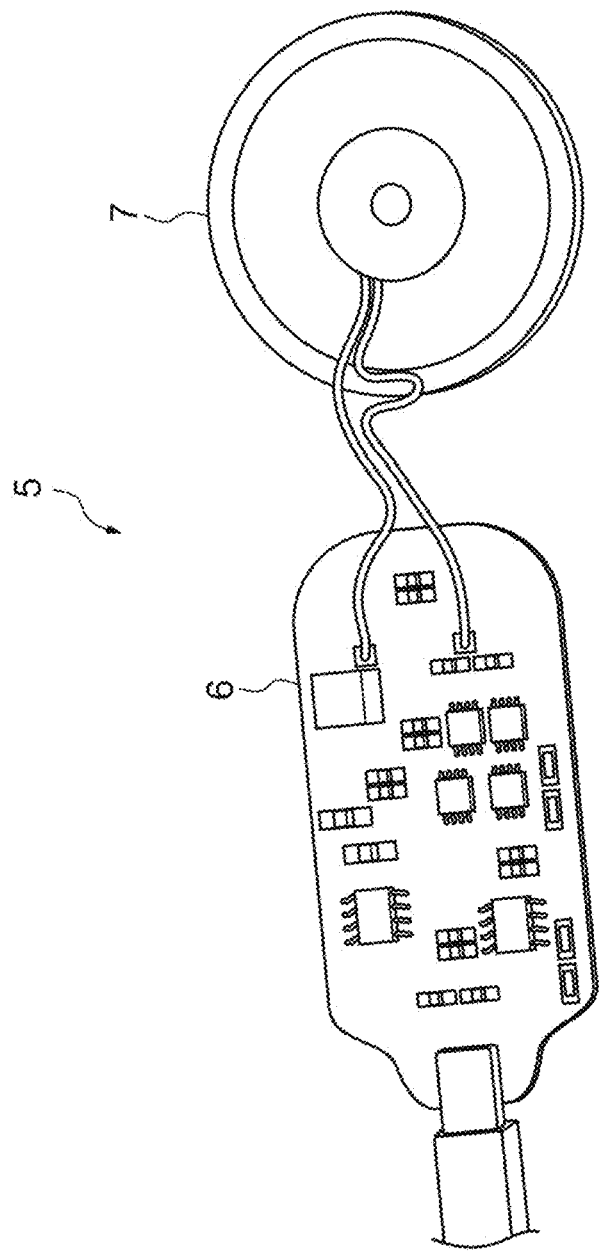
FIG. 2 is a diagram illustrating an example of a measurement target.

The measurement target, for example, includes various devices such as an electronic component, a substrate on which the electronic component is mounted, and a power source device. FIG. 2 illustrates an example of the measurement target. A measurement target 5 illustrated in FIG. 2 is a wireless charger. The measurement target 5 includes an electronic substrate 6 and a power feeding coil 7. The measurement target 5 wirelessly feeds power from the power feeding coil 7 to an electronic device such as a smart phone, in a state of being connected to a power source.

The electromagnetic environment analysis system 1 displays a result image in which a position at which the measurement has been performed and the measurement result are associated with each other. In this embodiment, the electromagnetic environment analysis system 1 displays a synthetic image in which the result image is superimposed on a captured image obtained by capturing an image of the measurement target. As a modification example of this embodiment, the electromagnetic environment analysis system 1 may display the result image on a transmissive display without creating the synthetic image. The electromagnetic environment analysis system 1, for example, may be a video see-through or optical see-through head-mounted display.

In this embodiment, the electromagnetic environment analysis system 1 acquires the captured image while performing the measurement, and updates and displays the result image. Accordingly, a user is capable of measuring a desired position with reference to the result image. As a modification example of this embodiment, the electromagnetic environment analysis system 1 may create and display the result image from the measurement result that is already measured.

As illustrated in FIG. 1, the electromagnetic environment analysis system 1 includes a range determination marker 2 and an electromagnetic environment analysis device 3. The range determination marker 2 is arranged in a real space and is a marker for determining a range for displaying the measurement result or a range for performing the measurement. "Being arranged in a real space" indicates not being virtually arranged on an image or the like. Hereinafter, the range to be determined by the range determination marker 2 will be referred to as a "display range". The range determination marker 2 is physically separated from the electromagnetic environment analysis device 3 and arranged in a position set in advance in the real space by the user. The range determination marker 2 has a feature point to enable the electromagnetic environment analysis device 3 to identify a three-dimensional position of the range determination marker 2 in the real space by image recognition. For example, the range determination marker 2 includes a figure such as a two-dimensional code having such a feature point. The two-dimensional code, for example, includes three-dimensional position information of the range determination marker 2. The three-dimensional position information is information that is capable of specifying the three-dimensional position of the range determination marker itself. In other words, the range determination marker 2 has information that is capable of specifying a relative position between the range determination marker 2 and a position in which the captured image is captured in the real space. The range determination marker 2 is not limited to such a configuration insofar as the electromagnetic environment analysis device 3 is capable of identifying the position of the range determination marker 2 in the real space.

Figure 3:
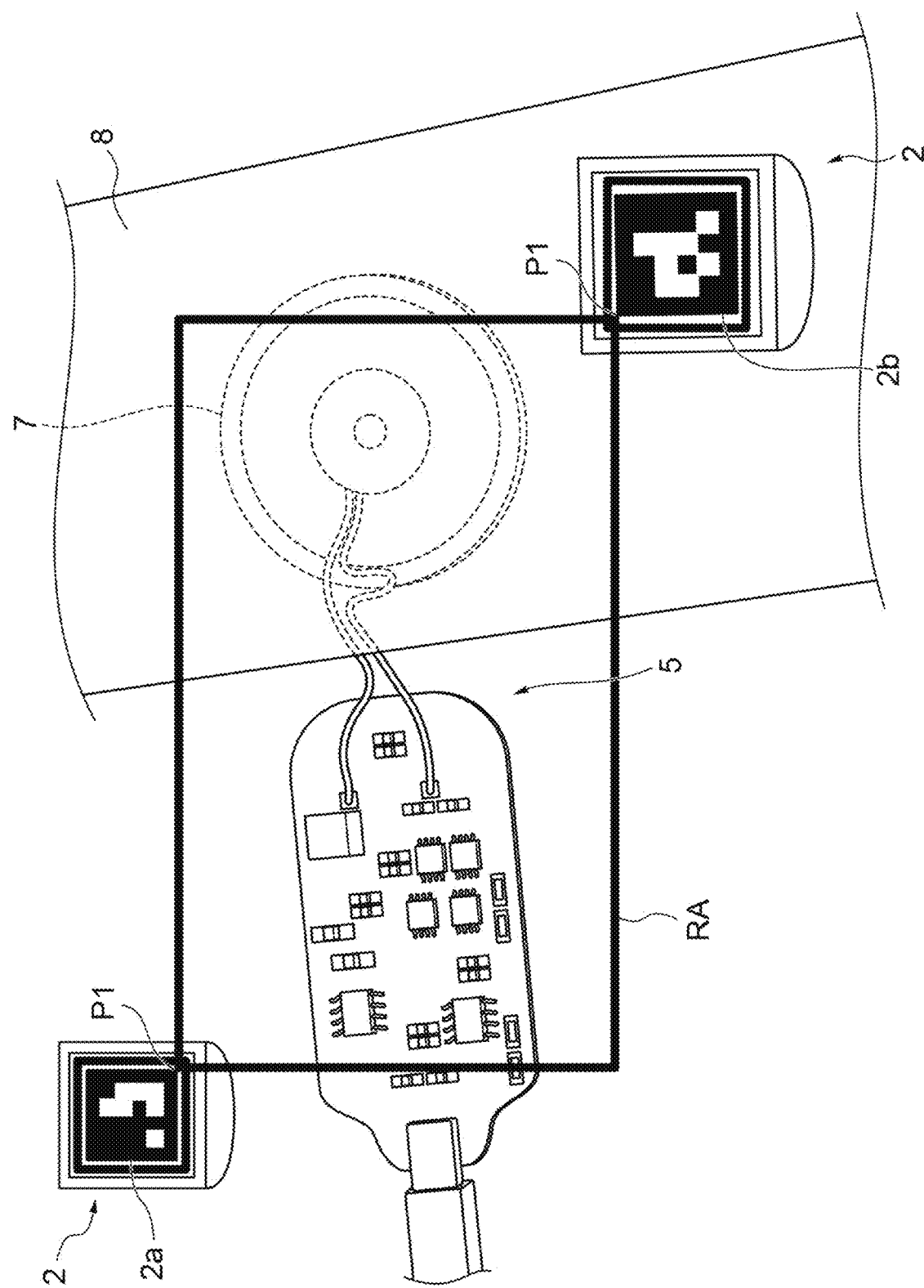
FIG. 3 is a diagram illustrating a state in which a display range of a measurement result is displayed.
Figure 4:
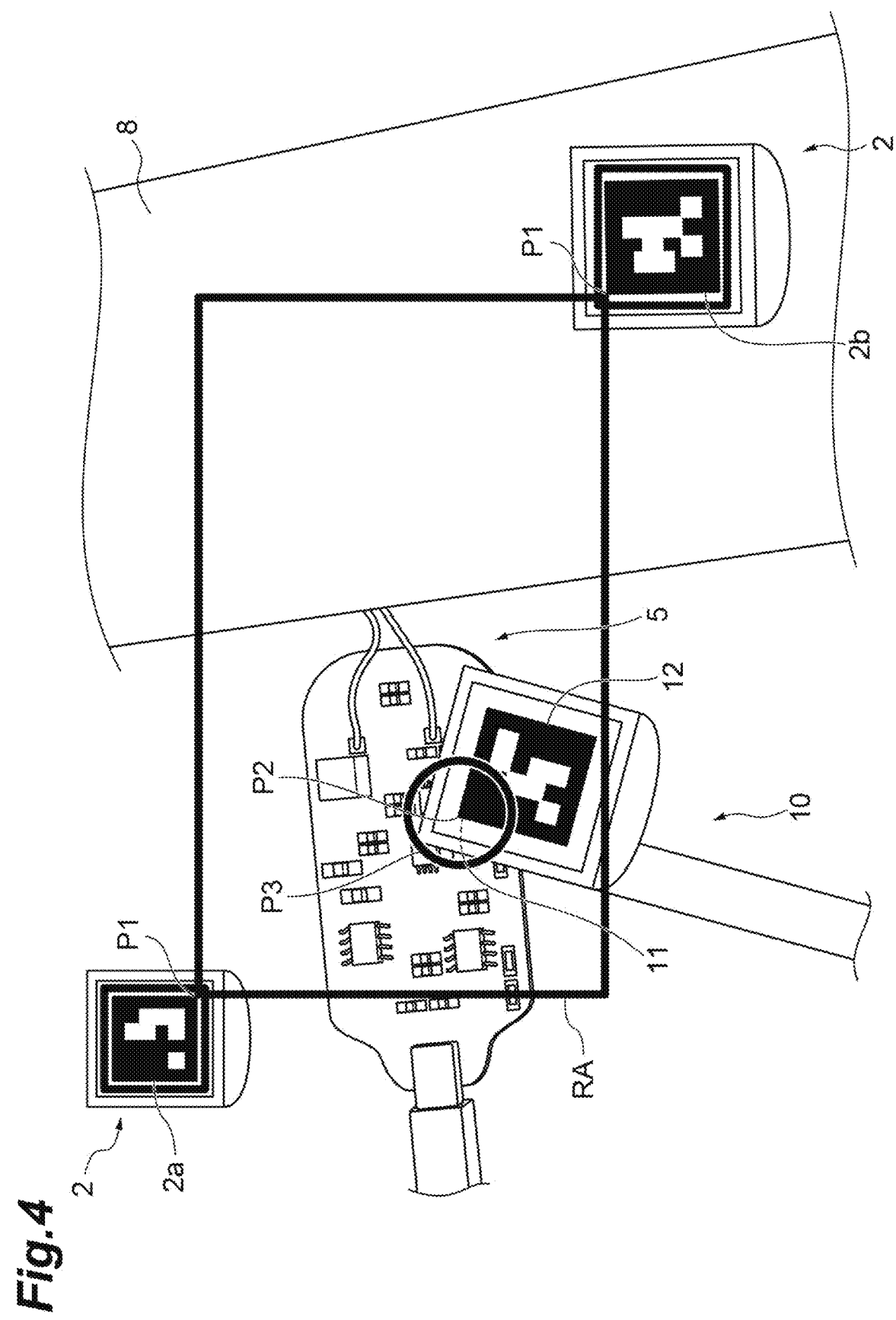
FIG. 4 is a diagram illustrating a state in which a measurement position is detected.
Figure 5:
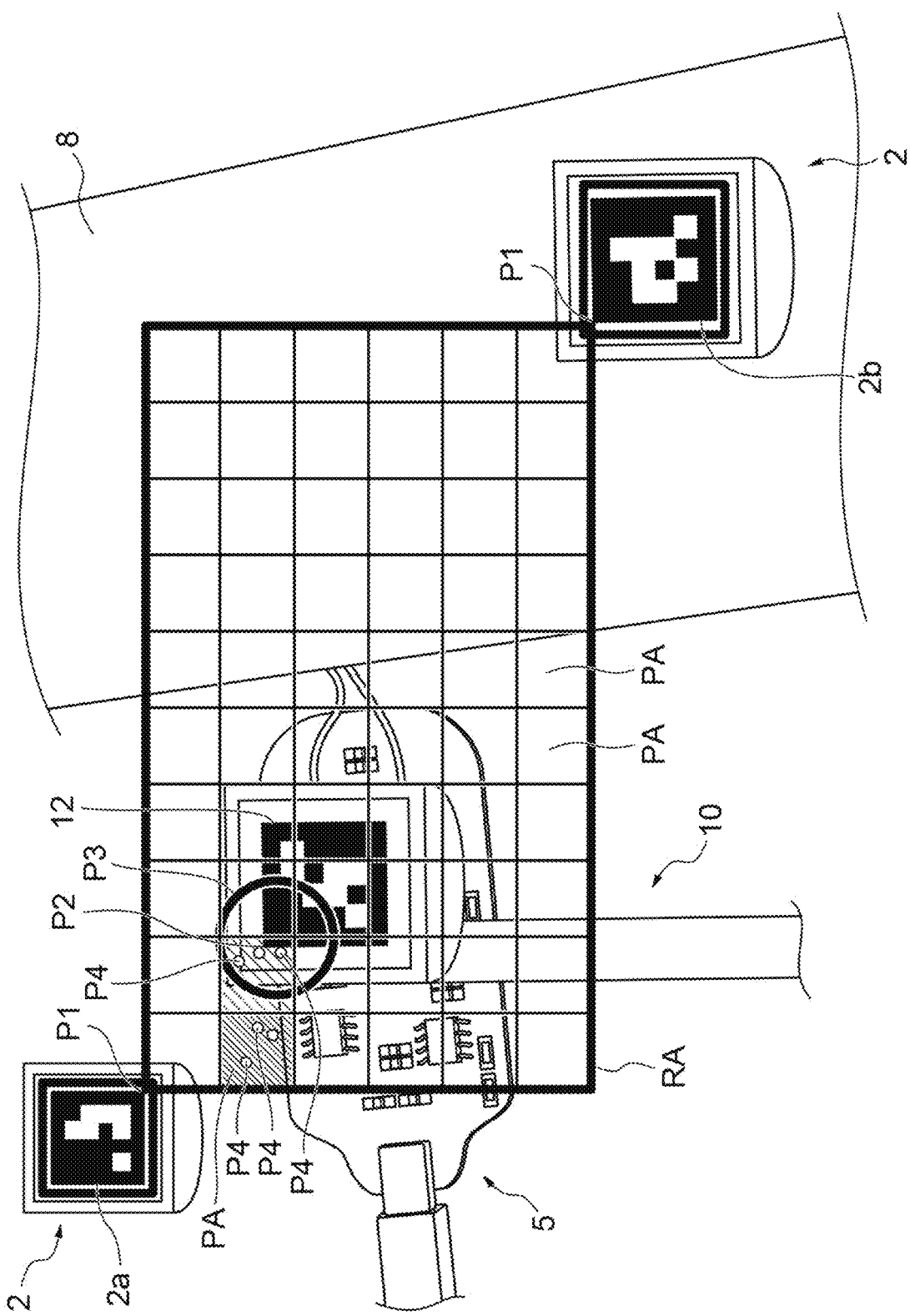
FIG. 5 is a schematic view illustrating the measurement position for each partition.

In this embodiment, as illustrated in FIG. 3 to FIG. 5, the range determination marker 2 includes a plurality of range determination markers 2a and 2b. Each of the plurality of range determination markers 2a and 2b is arranged in a position set in advance. In this embodiment, each of the range determination markers 2a and 2b includes the three-dimensional position information by the two-dimensional code or the like. Each of the range determination markers 2a and 2b does not have information that is capable of specifying the three-dimensional position only by itself, but may have information that is capable of specifying a position in the captured image. In FIG. 3 to FIG. 5, two range determination markers 2a and 2b are arranged around the measurement target 5. In the example illustrated in FIG. 3 to FIG. 5, the measurement target 5 is the wireless charger as described above. The measurement target 5 is operated in a state where a smart phone 8 is arranged on the power feeding coil 7. For example, a display range RA for displaying the measurement result is in a rectangular shape, and a vertex on a diagonal line of the display range RA is determined based on the two range determination markers 2a and 2b. A top-left vertex of the display range RA is determined by the range determination marker 2a, and a bottom-right vertex of the display range RA is determined by the range determination marker 2b.

In this embodiment, as illustrated in FIG. 3 to FIG. 5, the electromagnetic environment analysis device 3 determines the display range RA for displaying the measurement result by identifying the range determination marker 2. As a modification example of this embodiment, the electromagnetic environment analysis device 3 may determine the measurement range for performing the measurement in the real space by identifying the range determination marker 2.

As illustrated in FIG. 1, the electromagnetic environment analysis device 3 includes a manipulation unit 10 and a main unit 20. The manipulation unit 10 and the main unit 20 are electrically connected to each other in a wired or wireless manner. The manipulation unit 10 includes a sensor 11 and a sensor marker 12. As illustrated in FIG. 4 and FIG. 5, the manipulation unit 10 is manipulated by the user and arranged in a desired measurement position. The manipulation unit 10 is moved with respect to the measurement target 5 by the user. The manipulation unit 10 may be moved by being held in the hand of the user, or may be moved by a machine in accordance with an electronic manipulation of the user. The sensor 11 is positioned in the real space and sequentially detects information relevant to the electromagnetic environment. The sensor 11 sequentially detects a signal to be a target. The sensor 11, for example, includes an antenna, an electric field probe, or a magnetic field probe. The sensor 11 transmits the detected signal to the main unit 20. The sensor 11, for example, detects at least one of information relevant to the intensity of at least one of an electric field and a magnetic field, information relevant to the intensity of the electromagnetic wave, information relevant to the phase of the electromagnetic wave, and information relevant to the waveform of the electromagnetic wave, as detection information. The detection information, for example, includes a current value or a voltage value that is generated in the electric field probe or the magnetic field probe. The sensor 11 transfers the detection information that is detected to the main unit 20.

The sensor marker 12 is arranged on the sensor 11 in the real space and moved along with the sensor 11. In other words, the sensor 11 and the sensor marker 12 are also moved in accordance with the movement of the manipulation unit 10 by the user. The sensor marker 12 is a marker for acquiring the position of the sensor 11 in the real space. As with the range determination marker 2, the sensor marker 12 has a feature point to enable the electromagnetic environment analysis device 3 to identify a three-dimensional position of the sensor marker 12 in the real space by image recognition. For example, the sensor marker 12 includes a figure such as a two-dimensional code having such a feature point. The two-dimensional code, for example, includes three-dimensional position information of the sensor marker 12. The sensor marker 12 is not limited to such a configuration insofar as the electromagnetic environment analysis device 3 is capable of identifying the position of the sensor marker 12 in the real space. The sensor marker 12 does not have information that is capable of specifying the three-dimensional position only by itself, but may have information that is capable of specifying a position in the captured image.

As illustrated in FIG. 1, the main unit 20 includes an image capturing unit 21, a storage unit 22, a measurement processing unit 23, a display unit 24, and a display control unit 25. The image capturing unit 21, the storage unit 22, the measurement processing unit 23, the display unit 24, and the display control unit 25 may be contained in one housing, or may be divided in a plurality of housings. In a case where the image capturing unit 21, the storage unit 22, the measurement processing unit 23, the display unit 24, and the display control unit 25 are contained in the plurality of housings, the units may be connected to each other in a wired manner, or may be connected to each other in a wireless manner.

The image capturing unit 21 sequentially captures the captured images in the real space. The image capturing unit 21 captures an image at a predetermined time interval. The image capturing unit 21 transfers the captured image to the display control unit 25. In this embodiment, the image capturing unit 21 is provided in the housing held by the user. The image capturing unit 21 is moved by the user. The position and the posture of the image capturing unit 21 vary in accordance with the manipulation of the user.

The storage unit 22 stores data acquired in advance and data acquired from various function units in the main unit 20. The storage unit 22, for example, stores data acquired from the image capturing unit 21, the measurement processing unit 23, and the display control unit 25.

The measurement processing unit 23 acquires the detection information that is detected in the sensor 11, and processes the acquired detection information to be output as measurement information. The measurement information corresponds to the measurement result. The measurement processing unit 23, for example, functions as a spectrum analyzer, a network analyzer, or an oscilloscope. The measurement processing unit 23 transfers the measurement information to the display control unit 25. The measurement information includes a plurality of measurement values relevant to the electromagnetic environment and additional information corresponding to each of the measurement values. The measurement value includes various physical values. In this embodiment, the measurement value is a value indicating the intensity of the electromagnetic wave and corresponds to the measurement result. For example, the measurement value in this embodiment is a value indicating the intensity of the electric field or the magnetic field. The additional information, for example, includes at least one of the information relevant to the intensity of the electromagnetic wave, the information relevant to the phase of the electromagnetic wave, information relevant to a frequency component of the electromagnetic wave, and information relevant to a timing at which the measurement is performed.

The measurement processing unit 23 acquires the plurality of measurement values relevant to the electromagnetic environment, based on a detection result of the sensor 11. The measurement processing unit 23, for example, processes the detection information that is detected in the sensor 11, and calculates the intensity of a plurality of frequency components in each measurement, as the measurement information. The measurement processing unit 23, for example, sets the intensity of each of the frequency components in each measurement position, as the measurement value. For example, the measurement processing unit 23 calculates the intensity of 100 to 500 frequency components in a predetermined frequency band.

The display unit 24 displays at least one of the captured image of the image capturing unit 21 and a measurement image created in the display control unit 25. The measurement image is an image representing the measurement information processed in the measurement processing unit 23. The display unit 24 includes a display displaying an image. In this embodiment, the display unit 24 is provided in the same housing as the image capturing unit 21. The display unit 24 is moved along with the image capturing unit 21 by the user. As a modification example of this embodiment, the display unit 24 may display an image on an external display of the electromagnetic environment analysis system 1.

The display control unit 25 controls the display of the display unit 24. The display control unit 25 creates an image to be displayed on the display unit 24, based on at least one of the captured images of the image capturing unit 21 and the measurement information of the measurement processing unit 23. As illustrated in FIG. 1, the display control unit 25 includes a position information acquisition unit 31, a display range determination unit 32, a position relationship judgment unit 33, a measurement information acquisition unit 34, and an image creation unit 35.

The position information acquisition unit 31 acquires position information relevant to the measurement position in which each of the measurement values is measured. The position information acquisition unit 31, for example, calculates the position information relevant to the measurement position, based on the captured image of the image capturing unit 21. As illustrated in FIG. 1, the position information acquisition unit 31 includes a captured image acquisition unit 41, a marker detection unit 42, and a marker position calculation unit 43. The captured image acquisition unit 41 acquires the captured image from the image capturing unit 21. In other words, the captured image acquisition unit 41 acquires the captured images that are sequentially captured in the real space.

The marker detection unit 42 detects at least one of the range determination marker 2 and the sensor marker 12, based on the captured image acquired in the captured image acquisition unit 41. In this embodiment, at least one of the range determination marker 2 and the sensor marker 12 is detected from one captured image. The marker detection unit 42 detects the feature point of each of the range determination markers 2. The marker detection unit 42 detects the feature point of the sensor marker 12.

The marker position calculation unit 43 calculates the position of at least one of the range determination marker 2 and the sensor marker 12, based on a detection result of the marker detection unit 42. The marker position calculation unit 43 calculates a relative position between the range determination marker 2 and the sensor marker 12, based on a detection result of the range determination marker 2 and a detection result of the sensor marker 12. In this embodiment, the marker position calculation unit 43 calculates the position of at least one of the range determination marker 2 and the sensor marker 12 in the captured image. As a modification example of this embodiment, the marker position calculation unit 43 may calculate the three-dimensional position of at least one of the range determination marker 2 and the sensor marker 12 in the real space.

In this embodiment, the marker position calculation unit 43 calculates the three-dimensional position of each of the range determination markers 2, based on the feature point of each of the range determination markers 2 detected in the marker detection unit 42. For example, as illustrated in FIG. 3 to FIG. 5, the marker position calculation unit 43 calculates a position P1 of the corner of the two-dimensional code of each of the range determination markers 2 in the real space from the feature point of each of the range determination markers 2, as the vertex of the display range. In this embodiment, the marker position calculation unit 43 calculates the three-dimensional position of the sensor marker 12, based on the feature point of the sensor marker 12 detected in the marker detection unit 42. For example, as illustrated in FIG. 4 and FIG. 5, the marker position calculation unit 43 calculates a position P2 of the corner of the two-dimensional code of the sensor marker 12 in the real space from the feature point of the sensor marker 12. The position P2 of the sensor marker 12 corresponds to the position of the sensor 11. The position of the sensor 11 at the measurement corresponds to the measurement position. Hereinafter, the position of the sensor 11 will be referred to as a "sensor position".

The display range determination unit 32 determines the display range RA in which information relevant to the measurement value is displayed in the image, based on the detection result of the marker detection unit 42. The display range determination unit 32 determines the display range RA for displaying the measurement information in the display unit 24, based on the position of the range determination marker 2 calculated in the marker position calculation unit 43. In this embodiment, the display range determination unit 32, for example, determines the display range RA, based on the positions of two range determination markers 2 calculated in the marker position calculation unit 43. For example, the marker position calculation unit 43 calculates the positions P1 of the range determination markers 2a and 2b or the size of a region defined by the range determination markers 2a and 2b, based on the detection result of the marker detection unit 42. For example, as illustrated in FIG. 3 to FIG. 5, the display range determination unit 32 determines the region of a rectangle in which the positions P1 of the respective range determination markers 2 are two vertices on the diagonal line, as the display range RA. In other words, the display range determination unit 32, for example, determines the region of a quadrangle in which a line portion connecting the position P1 of the range determination marker 2a and the position P1 of the range determination marker 2b is the diagonal line, as the display range RA.

The marker position calculation unit 43 may calculate the size of one range determination marker 2, based on the detection result of the marker detection unit 42. For example, the marker position calculation unit 43 may acquire information relevant to a relative position between the image capturing unit 21 and the range determination marker 2 from the size of the range determination marker 2. In this case, the display range determination unit may determine the display range RA having a size corresponding to the information relevant to the relative position between the image capturing unit 21 and the range determination marker 2. For example, the display range determination unit 32 may determine the radius of the circle described above, based on the size of the one range determination marker 2 calculated by the marker position calculation unit 43.

The position relationship judgment unit 33 judges a position relationship between the display range RA determined by the display range determination unit 32 and the sensor position calculated by the marker position calculation unit 43. For example, the position relationship judgment unit 33 judges whether or not the sensor position is positioned in the display range RA. For example, the position relationship judgment unit 33 judges whether or not the position P2 of the sensor marker 12 is positioned in the display range RA.

The measurement information acquisition unit 34 acquires the measurement information from the measurement processing unit 23. In other words, the measurement information acquisition unit 34 acquires the plurality of measurement values relevant to the electromagnetic environment, and the additional information corresponding to each of the measurement values. The measurement information acquisition unit 34 acquires the plurality of measurement values output from the measurement processing unit 23, based on the detection information that is detected by the sensor 11. The measurement information acquisition unit 34 transfers the acquired measurement information to the image creation unit 35. The measurement information acquisition unit 34, for example, associates the measurement position and the measurement value with each other to be stored in the storage unit 22. The measurement information acquisition unit 34 may acquire the measurement value and the measurement position, which are associated with each other, from the storage unit 22.

The image creation unit 35 creates an image for displaying the information relevant to the measurement value in a position associated with the measurement position of each of the measurement values. The image created in the image creation unit 35, for example, is displayed on the display unit 24. The image creation unit 35 creates the image, based on the detection result of the marker detection unit 42. The image creation unit 35 creates a result image in which the measurement position calculated in the marker position calculation unit 43 and the measurement result are associated with each other. In this embodiment, the result image includes at least one of information indicating the sensor position, information indicating the display range RA, and information indicating the measurement result. As illustrated in FIG. 4 and FIG. 5, the information indicating the sensor position, for example, is a circle P3 centered on the measurement position. For example, the result image represents the display range RA and represents the measurement result in the display range RA. In a case where the measurement value corresponding to the display range RA is not acquired, the image creation unit 35 creates the result image representing only the display range RA. In this embodiment, the image creation unit 35 creates a synthetic image in which the result image is superimposed on the captured image. As illustrated in FIG. 1, the image creation unit 35 includes a partition processing unit 51, a display information determination unit 52, and a synthesis unit 53.

As illustrated in FIG. 5, the partition processing unit 51 performs processing of setting a plurality of partitions PA in the display range RA. The plurality of partitions PA are regions to which the display range RA is sectioned. In other words, the display range RA includes the plurality of partitions PA. In other words, the plurality of partitions PA are regions to which the display range RA, in which the measurement result is displayed in the result image created in the image creation unit 35, is sectioned. Each of the partitions PA is larger than the resolution of the measurement position. FIG. 5 illustrates a state in which a plurality of measurement positions P4 are positioned in one partition PA. As illustrated in FIG. 1, the partition processing unit 51 includes a partition setting unit 61, a partition judgment unit 62, and a resetting judgment unit 63.

The partition setting unit 61 sets the plurality of partitions PA in the display range RA. In other words, the partition setting unit 61 sets the plurality of partitions PA by sectioning the display range RA in which the information relevant to the measurement value is displayed. In other words, the display range RA includes the plurality of partitions PA. In this embodiment, the partition setting unit 61 sets the plurality of partitions PA, based on information indicated in a partition definition table, with reference to the partition definition table stored in advance in the storage unit 22. FIG. 6A and FIG. 6B illustrate an example of the partition definition table. The storage unit 22, for example, stores a plurality of partition definition tables 71 and 72 in advance. Each of the partition definition tables 71 and 72 defines the configuration of the plurality of partitions forming the display range RA. The plurality of partition definition tables 71 and 72 define the configurations of each of the partitions PA in cases where the display range RA is sectioned to the numbers different from each other. In other words, the configurations of each of the partitions PA in cases where the display range RA is sectioned to the numbers different from each other are defined.

For example, the partition setting unit 61 sets a partition definition table to be used in the judgment of the partition judgment unit 62 from the plurality of partition definition tables 71 and 72 stored in advance in the storage unit 22. The partition definition table 71 illustrated in FIG. 6A and the partition definition table 72 illustrated in FIG. 6B indicate the size and the number of partitions PA forming the display range RA, and a position in which each of the partitions PA is set. The partition definition table may indicate the number of sectioned display ranges RA. FIG. 7A illustrates a state in which the display range RA is sectioned based on the partition definition table 71. FIG. 7B illustrates a state in which the display range RA is sectioned based on the partition definition table 72. The partition PA is changed to a partition PA2 from a partition PA1 by changing the partition definition table. In the partition definition table 71 and the partition definition table 72, the number of sectioned display ranges RA is different. The partition PA1 and the partition PA2 have sizes different from each other. The size of each of the partitions PA indicated in the partition definition table 72 is smaller than the size of each of the partitions PA indicated in the partition definition table 71.

The partition judgment unit 62 judges the partition PA corresponding to the measurement position of each of the measurement values in the plurality of partitions PA, based on the position information acquired in the position information acquisition unit 31. In this embodiment, the partition judgment unit 62 calculates the coordinates of the measurement position P4 in the display range RA, that is, the coordinates of the position P2 of the sensor marker 12, based on the relative position between the range determination marker 2 and the sensor marker 12, which is calculated in the marker position calculation unit 43. For example, the partition judgment unit 62 calculates the coordinates of the position P2 of the sensor marker 12 with the position P1 of the range determination marker 2a as the origin. The partition judgment unit 62 judges the partition PA corresponding to the measurement value, based on the calculated coordinates. In this embodiment, the partition judgment unit 62 judges the partition PA corresponding to the measurement position of each of the measurement values, based on the partition definition table set in the partition setting unit 61.

The partition judgment unit 62, for example, stores a judgment result in the storage unit 22.

FIG. 8 illustrates an example of the measurement information stored in the storage unit 22 after the partition is judged by the partition judgment unit 62. In FIG. 8, the storage unit 22 stores measurement information items D1 to D4 in which an X coordinate and a Y coordinate indicating the measurement position, and the measurement value are associated with each other. In the section of the partition in FIG. 8, a judgment result of the partition judgment unit 62 is illustrated. In the example illustrated in FIG. 8, the partition PA corresponding to the measurement position of each of the measurement values is judged based on the partition definition table 71 and the X coordinate and the Y coordinate indicating the measurement position.

The resetting judgment unit 63 judges whether or not to reset the plurality of partitions PA by the partition setting unit 61. In other words, the resetting judgment unit 63 judges whether or not to change the size of the plurality of partitions PA forming the display range RA. In a case where the resetting judgment unit 63 judges to reset the plurality of partitions PA, the partition setting unit 61 resets the plurality of partitions PA by changing the number of partitions PA forming the display range RA. For example, the partition setting unit 61 resets the plurality of partitions PA by changing the number of sectioned display ranges RA. For example, in a case where the resetting judgment unit 63 judges to reset the plurality of partitions PA, the partition setting unit 61 changes the partition definition table. In this case, the partition setting unit 61 changes the partition definition table for reference, for example, to the partition definition table 72 illustrated in FIG. 6B from the partition definition table 71 illustrated in FIG. 6A. In a case where the resetting judgment unit 63 judges to reset the plurality of partitions PA, the partition setting unit 61, for example, resets the plurality of partitions PA forming the display range RA from a plurality of partitions PA1 illustrated in FIG. 7A to a plurality of partitions PA2 illustrated in FIG. 7B, by changing the partition definition table.

In a case where the plurality of partitions PA are reset by the partition setting unit 61, the partition judgment unit 62 judges the partition PA corresponding to the measurement position of each of the measurement values in the plurality of reset partitions PA. In other words, the partition judgment unit 62 judges again the partition PA corresponding to the measurement position of each of the measurement values, based on the changed partition definition table. For example, in a case where the resetting judgment unit 63 judges to reset the plurality of partitions PA, and the partition setting unit 61 resets the plurality of partitions PA2, the partition judgment unit 62 judges the partition PA2 corresponding to the measurement position of each of the measurement values in the plurality of partitions PA2, based on the position information.

In this embodiment, in a case where a predetermined condition is satisfied in the processing of the electromagnetic environment analysis device 3, the resetting judgment unit 63 judges to perform the resetting. For example, in a case where the number of partitions PA corresponding to the measurement value is greater than a predetermined number, the resetting judgment unit 63 judges to perform the resetting. In other words, in a case where the number of partitions PA in which the measurement result is displayed is greater than a predetermined value, the resetting judgment unit 63 judges to perform the resetting. For example, in a case where a ratio of the number of partitions PA corresponding to the measurement value to the number of divided display ranges RA is greater than a predetermined value, the resetting judgment unit 63 judges to perform the resetting. The "number of divided display ranges RA" means the number of sectioned display ranges RA, that is, the number of partitions PA forming the display range RA. In a case where the number of times of the resetting of the plurality of partitions PA is greater than a predetermined number, the resetting judgment unit 63 inhibits the resetting of the plurality of partitions PA.

In a case where at least one of a plurality of conditions set in advance is satisfied, the resetting judgment unit 63 may judge to reset the plurality of partitions PA. The size of each of the partitions reset by the partition setting unit 61 may be different in accordance with the condition to be satisfied. That is, the number of sectioned display ranges RA may be different in accordance with the condition to be satisfied.

The plurality of conditions may be manipulations of the user or calculations, which are different from each other, or may be different times or different numbers of times of inputting the same manipulation or calculation. For example, in a case where a condition such as a first input manipulation of the user is satisfied, the partition setting unit 61 may reset the plurality of partitions PA, and in a case where a condition such as a second input manipulation of the user is satisfied, the partition setting unit 61 may reset again the plurality of partitions PA. At this time, the size of each of the partitions reset by the partition setting unit 61 in a case where the condition such as the first input manipulation is satisfied may be smaller than the size of each of the partitions reset by the partition setting unit 61 in a case where the condition such as the second input manipulation is satisfied. In other words, the size of each of the partitions reset by the partition setting unit 61 in a case where a first condition is satisfied may be smaller than the size of each of the partitions reset by the partition setting unit 61 in a case where a second condition, which is satisfied before the first condition is satisfied, is satisfied.

As a modification example of this embodiment, the resetting judgment unit 63 may judge to perform the resetting, in accordance with a predetermined input manipulation of the user. For example, in a case where a switch is manipulated by the user, the resetting judgment unit 63 may judge to perform the resetting. For example, the resetting judgment unit 63 judges that a predetermined condition is satisfied in the processing of the electromagnetic environment analysis device 3 and the predetermined input manipulation is performed by the user, in accordance with the state of a flag.

The display information determination unit 52 determines information to be displayed on the display unit 24. For example, the information determined by the display information determination unit 52 is displayed on the display unit 24, as an image. The display information determination unit 52, for example, determines information to be used in the creation of the result image. The display information determination unit 52 determines information relevant to the display of each of the partitions PA, based on the measurement value corresponding to each of the partitions PA. The display information determination unit 52 determines information to be displayed in the partition PA with which the measurement value is associated. In this embodiment, in a case where there is the partition PA with which the measurement value is not associated, the display information determination unit 52 determines the information to be displayed in the partition PA as Null. As a modification example of this embodiment, the display information determination unit 52 may not determine the information in the partition PA with which the measurement value is not associated.

In a case where the resetting judgment unit 63 judges to reset the plurality of partitions PA, the display information determination unit 52 determines information relevant to the display of the partition PA, based on the measurement value corresponding to the reset partition PA. For example, in a case where the resetting judgment unit 63 judges to reset the plurality of partitions PA, and the partition setting unit 61 resets the plurality of partitions PA2, the display information determination unit 52 determines information relevant to the display of the partition PA2, based on the measurement value corresponding to the partition PA2.

The display information determination unit 52, for example, determines a representative value from the measurement value corresponding to each of the partitions PA, and determines the information relevant to the display of each of the partitions PA, based on the representative value. The information relevant to the display of each of the partitions PA, for example, is a color to be displayed in each of the partitions PA. The information relevant to the display of each of the partitions PA may be not only a color but also a number or a symbol indicating the representative value. In this embodiment, in a case where there is the partition PA with which the measurement value is not associated, the display information determination unit 52 determines the representative value of the partition PA as Null. In a case where the representative value corresponding to the partition PA is Null, the display information determination unit 52 determines information such as setting the partition PA to be achromatous or non-display.

Figure 9:
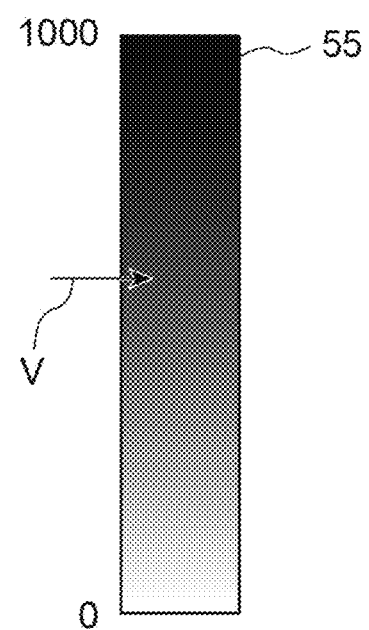
FIG. 9 is a diagram for describing determination of a color.

The display information determination unit 52, for example, determines the color to be displayed in each of the partitions PA, in accordance with the size of the measurement value corresponding to each of the partitions PA. For example, the display information determination unit 52 determines a color corresponding to the size of the measurement value in a color distribution table 55 illustrated in FIG. 9, as the color to be displayed in each of the partitions PA. In FIG. 9, an arrow V represents a measurement value in a certain partition PA. In FIG. 9, the density of the color to be displayed in each of the partitions PA increases as the measurement value increases. For example, as illustrated in FIG. 5, the plurality of partitions PA are color-coded in accordance with the size of the measurement value positioned in each of the partitions PA. The display information determination unit 52 may display an icon in the partition PA including a predetermined representative value in the display range RA. The predetermined representative value, for example, is the maximum representative value in the display range RA. The predetermined representative value, for example, is the minimum representative value or the like in the display range RA.

As illustrated in FIG. 5, in a case where two or more measurement values measured at timings different from each other correspond to one partition PA, the display information determination unit 52 calculates a representative value from the two or more measurement values, and determines the information relevant to the display of the partition PA, based on the representative value. The "two or more measurement values corresponding to one partition P" indicates that the measurement positions P4 of the two or more measurement values are arranged in one partition. The display information determination unit 52 calculates the representative value from the two or more measurement values, based on the additional information. "Calculating the representative value from the two or more measurement values" includes "selecting the representative value from the two or more measurement values". In this embodiment, the display information determination unit 52 selects the representative value from the two or more measurement values, based on the information relevant to the intensity of the electromagnetic wave. For example, the display information determination unit 52 determines information relevant to the display of the partition PA by using the maximum value, the minimum value, the medium value, or the mode value in the two or more measurement values, as the representative value. As a modification example of this embodiment, the display information determination unit 52 may calculate the average value of the two or more measurement values, and may determine the information relevant to the display of the partition PA by using the calculated average value as the representative value.

As a modification example of this embodiment, the display information determination unit 52 may determine the information relevant to the display of each of the partitions PA, based on the frequency component. For example, a case where the plurality of measurement values include a plurality of first measurement values relevant to an electromagnetic wave of a first frequency component and a plurality of second measurement values relevant to an electromagnetic wave of a second frequency component will be considered. In this case, the display information determination unit 52, for example, determines first information relevant to the display of the partition PA, based on the first measurement value corresponding to the partition PA. The display information determination unit 52, for example, determines second information relevant to the display of the partition PA, based on the second measurement value corresponding to the partition PA. In a case where two or more first measurement values measured at timings different from each other correspond to one partition PA, the display information determination unit 52 calculates a first representative value from two or more first measurement values, and determines the first information relevant to the display of the partition PA, based on the first representative value. In a case where two or more second measurement values measured at timings different from each other correspond to one partition PA, the display information determination unit 52 calculates second representative value from the two or more second measurement values, and determines the second information relevant to the display of the partition PA, based on the second representative value. The first information and the second information may be simultaneously displayed in each of the partitions PA.

As a modification example of this embodiment, the display information determination unit 52 may select at least one measurement value from the two or more measurement values, based on the frequency component, and may calculate the representative value from the at least one selected measurement value. For example, the display information determination unit 52 may calculate one measurement value from the two or more measurement values selected based on the frequency component, as the representative value, based on the additional information other than the frequency component. For example, the display information determination unit 52 may determine the information relevant to the display of the partition PA by using the average value of the two or more measurement values selected based on the frequency component, as the representative value, based on the information relevant to the intensity of the electromagnetic wave. For example, the display information determination unit 52 may select a measurement value relevant to an electromagnetic wave in a predetermined frequency band from the two or more measurement values. The display information determination unit 52 may select a measurement value relevant to electromagnetic waves of frequency components in a plurality of bands from the two or more measurement values.

The synthesis unit 53 creates a synthetic image in which the result image and the captured image are synthesized. The image creation unit 35 outputs the synthetic image created in the synthesis unit 53 to the display unit 24. In a case where at least one of the result image and the captured image does not exist, the synthesis unit 53 does not create the synthetic image. In a case where there is no captured image, the image creation unit 35 outputs only the result image to the display unit 24. In a case where there is no result image, the image creation unit 35 outputs only the captured image to the display unit 24.

Figure 10:
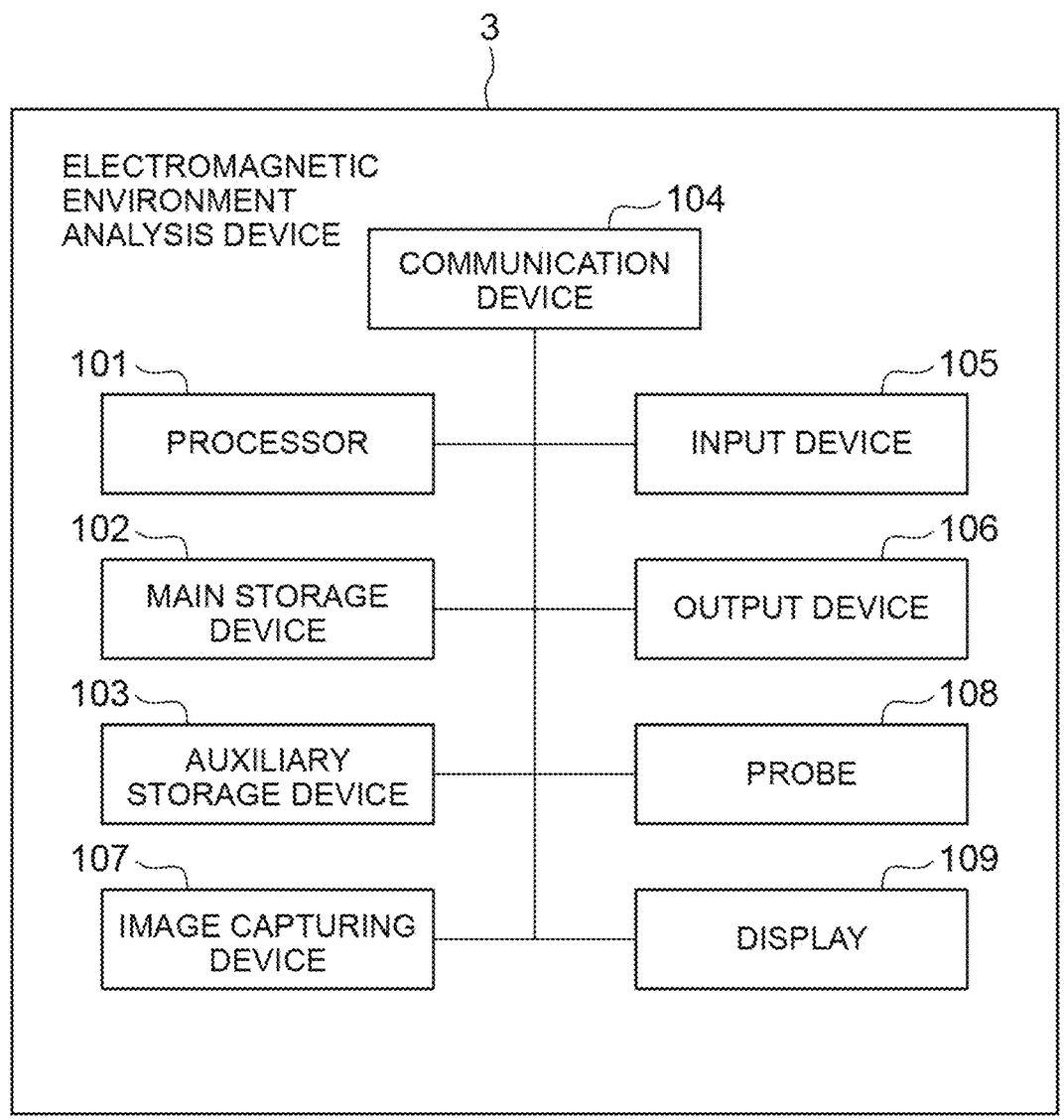
FIG. 10 is a diagram illustrating an example of a hardware configuration of the electromagnetic environment analysis system.

Next, a hardware configuration of the electromagnetic environment analysis device 3 will be described with reference to FIG. 10. FIG. 10 is a diagram illustrating an example of the hardware configuration of the electromagnetic environment analysis device 3.

The electromagnetic environment analysis device 3 includes a processor 101, a main storage device 102, an auxiliary storage device 103, a communication device 104, an input device 105, an output device 106, an image capturing device 107, a probe 108, and a display 109. The electromagnetic environment analysis device 3 includes one or a plurality of computers configured with the hardware described above and software such as a program. The electromagnetic environment analysis device 3 is attained in cooperation with hardware.

In a case where the electromagnetic environment analysis device 3 includes a plurality of computers, such computers may be locally connected to each other, or may be connected to each other via a communication network such as the internet or an intranet. According to such connection, one electromagnetic environment analysis device 3 is logically constructed.

The processor 101 executes an operating system, an application or a program, and the like. The main storage device 102 includes a read only memory (ROM) and a random access memory (RAM). For example, at least a part of the measurement processing unit 23 and the display control unit 25 is attained by the processor 101 and the main storage device 102. The processor 101 and the main storage device 102 configure a part of the spectrum analyzer, the network analyzer, or the oscilloscope.

The auxiliary storage device 103 is a storage medium including a hard disk, a flash memory, and the like. The auxiliary storage device 103, in general, stores a larger amount of data than the main storage device 102. For example, at least a part of the storage unit 22 is attained by the auxiliary storage device 103.

The auxiliary storage device 103 stores in advance data that is required for a program and processing. The program allows the computer to execute each functional element of the electromagnetic environment analysis device 3. According to the program, for example, processing S1, and processing S3 or processing S7 to processing S25, described below, are executed by the computer. Such a program, for example, may be provided after being recorded in a tangible recording medium such as a CD-ROM, a DVD-ROM, and a semiconductor memory. Such a program may be provided as a data signal via a communication network.

The communication device 104 includes a network card or a wireless communication module. For example, at least a part of the captured image acquisition unit 41 and the measurement information acquisition unit 34 is attained by the communication device 104. The input device 105 includes a keyboard, a mouse, a touch panel, and the like. For example, at least a part of the manipulation unit 10, the display unit 24, the captured image acquisition unit 41, the measurement information acquisition unit 34, and the resetting judgment unit 63 is attained by the input device 105. The output device 106 includes a buzzer, a printer, and the like. For example, at least a part of the image creation unit 35 is attained by the output device 106.

The image capturing device 107 includes a video camera or a still camera. For example, at least a part of the image capturing unit 21 is attained by the image capturing device 107. The probe 108 is connected to an input terminal of the spectrum analyzer, the network analyzer, or the oscilloscope. For example, at least a part of the manipulation unit 10 is attained by the probe 108. The display 109 includes a monitor of a computer, a display screen of a mobile terminal, or a projection screen. For example, at least a part of the display unit 24 is attained by the display 109.

Figure 11:
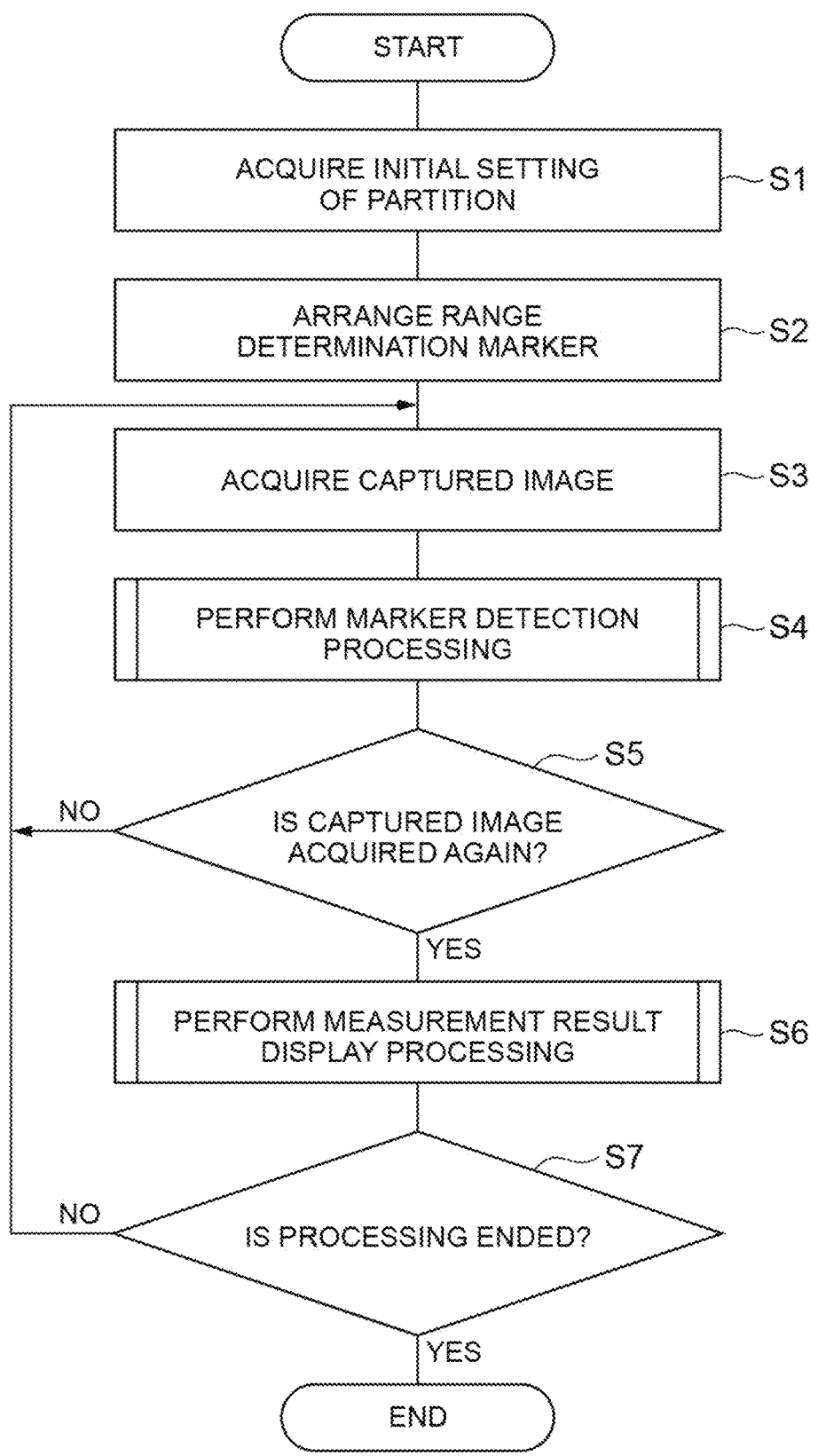
FIG. 11 is a flowchart illustrating a measurement method using the electromagnetic environment analysis system.

Next, an example of a measurement method using the electromagnetic environment analysis system will be described with reference to FIG. 11 to FIG. 14. FIG. 11 is a flowchart illustrating an electromagnetic environment analysis method using the electromagnetic environment analysis system.

First, the partition processing unit 51 acquires the initial setting of the plurality of partitions PA (processing S1). For example, the partition processing unit 51 acquires the initial setting stored in advance in the storage unit 22. The initial setting, for example, includes the partition definition table.

Next, the range determination marker 2 is arranged (processing S2). For example, the user arranges a plurality of range determination markers 2 around the display range of the measurement result. In other words, the user arranges the plurality of range determination markers 2 around a range in which the measurement is performed. The plurality of range determination markers 2 may be arranged in the position set in advance by a device (not illustrated) of the electromagnetic environment analysis system 1. In this embodiment, as illustrated in FIG. 3, two range determination markers 2 are respectively arranged at the vertices on the diagonal line of the desired display range RA.

Next, the captured image acquisition unit 41 acquires the captured image (processing S3). The captured image acquisition unit 41 acquires the captured image that is captured in the image capturing unit 21. The image capturing unit 21 captures the image of the range determination marker 2. For example, the image capturing unit 21 performs image capturing such that all of the plurality of range determination markers 2 arranged in processing S2 fall into the captured image. For example, the image capturing unit 21 performs image capturing such that the feature point indicating the three-dimensional position of each of the range determination markers 2 is acquired. In processing S3, the image capturing unit 21 may capture the image of the sensor marker 12 along with the range determination marker 2.

Next, marker detection processing is performed by the marker detection unit 42, the marker position calculation unit 43, the display range determination unit 32, and the position relationship judgment unit 33 (processing S4). In the marker detection processing, the position of at least one of the range determination marker 2 and the sensor marker 12 is acquired from the captured image acquired in processing S3. In the marker detection processing, a position relationship between the range determination marker 2 and the sensor marker 12 is judged.

Next, the display control unit 25 judges whether or not to acquire again the captured image (processing S5). The display control unit 25 judges whether or not to acquire again the captured image, based on the detection result of the range determination marker 2 and the sensor marker 12 in processing S4. In a case where it is judged to acquire again the captured image, the processing returns to processing S3.

In processing S5, in a case where it is judged not to acquire again the captured image, measurement result display processing is performed by the image creation unit 35 (processing S6). In the measurement result display processing, the result image, in which the position in which the measurement has been performed and the measurement result are associated with each other, is displayed on the display unit 24.

Next, the display control unit 25 judges whether or not to end the processing (processing S7). In processing S7, in a case where it is judged not to end the processing, the processing returns to processing S3. In processing S7, in a case where it is judged to end the processing, a set of processings are ended.

Figure 12:
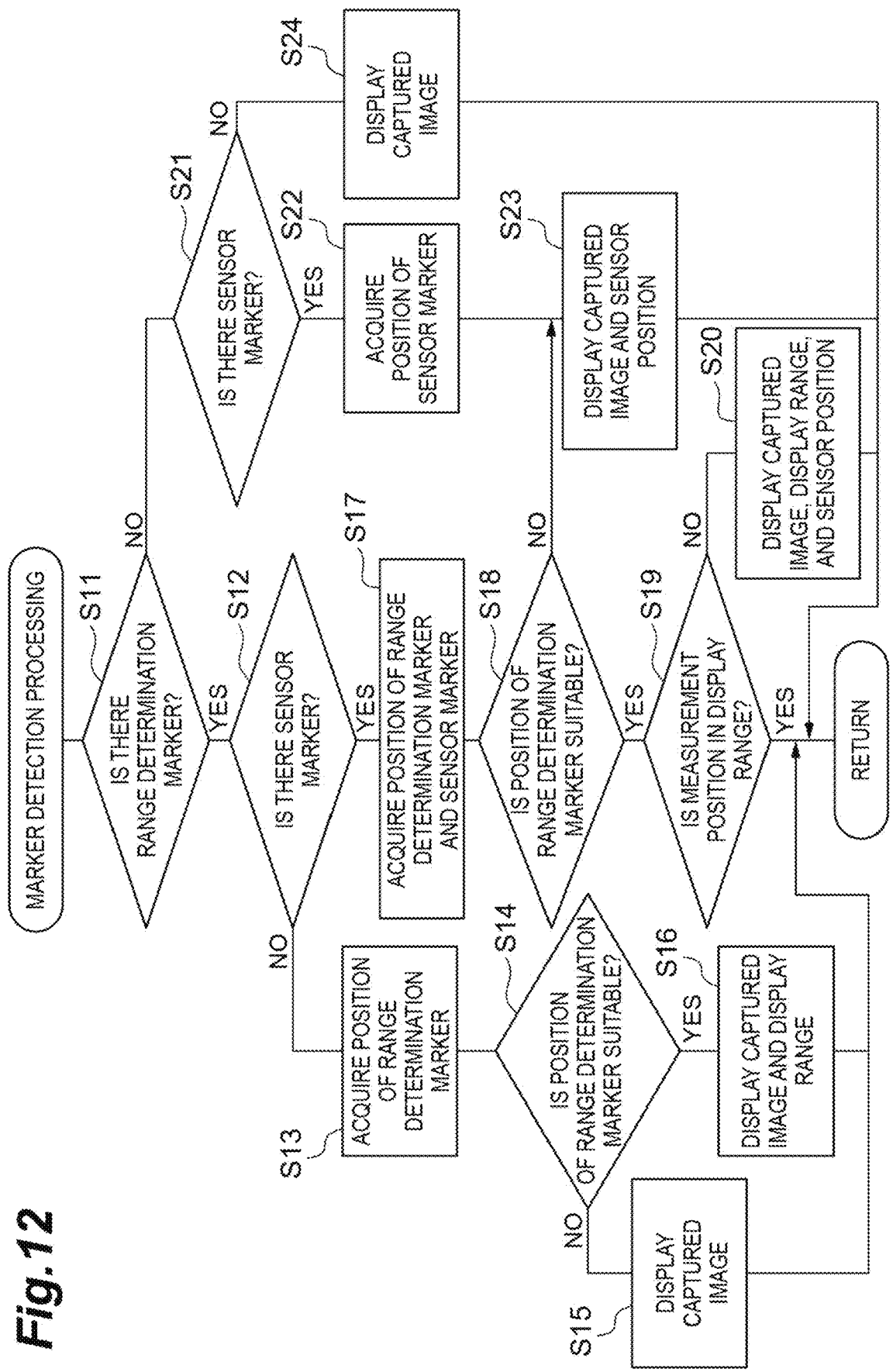
FIG. 12 is a flowchart illustrating marker detection processing.

Next, the marker detection processing in processing S4 will be described in detail. FIG. 12 is a flowchart illustrating the marker detection processing.

First, the marker detection unit 42 judges whether or not there is the range determination marker 2 in the captured image (processing S11). The marker detection unit 42, for example, performs image detection of the feature point of the range determination marker 2 from the captured image. In a case where the feature point of the range determination marker 2 is recognized in the captured image, the marker detection unit 42 judges that there is the range determination marker 2 in the captured image. In a case where the feature point of the range determination marker 2 is not recognized in the captured image, the marker detection unit 42 judges that there is no range determination marker 2 in the captured image. In processing S11, in a case where it is judged that there is the range determination marker 2, the processing proceeds to processing S12. In processing S11, in a case where it is judged that there is no range determination marker 2, the processing proceeds to processing S21.

In a case where it is judged that there is the range determination marker 2 in processing S11, it is judged whether or not there is the sensor marker 12 in the captured image (processing S12). The marker detection unit 42, for example, performs image detection of the feature point of the sensor marker 12 from the captured image. In a case where the feature point of the sensor marker 12 is recognized in the captured image, the marker detection unit 42 judges that there is the sensor marker 12 in the captured image. In a case where the feature point of the sensor marker 12 is not recognized in the captured image, the marker detection unit 42 judges that there is no sensor marker 12 in the captured image. In processing S12, in a case where it is judged that there is the sensor marker 12, the processing proceeds to processing S17. In processing S12, in a case where it is judged that there is no sensor marker 12, the processing proceeds to processing S13.

In a case where it is judged that there is no sensor marker 12 in processing S12, the marker position calculation unit 43 acquires the position P1 of the range determination marker 2 (processing S13). For example, the marker position calculation unit 43 calculates the position P1 of the range determination marker 2 in the captured image, and outputs a calculation result to the position relationship judgment unit 33 and the storage unit 22.

In a case where processing S13 ends, the position relationship judgment unit 33 judges whether or not the position P1 of the range determination marker 2 is suitable (processing S14). For example, the position relationship judgment unit 33 judges whether or not a position relationship between the plurality of range determination markers 2a and 2b is suitable. For example, in a case where each of the range determination markers 2a and 2b is arranged in a position in which the rectangular display range RA can be specified, the position relationship judgment unit 33 judges that the position relationship between the plurality of range determination markers 2a and 2b is suitable. For example, in a case where the position P1 of the range determination marker 2a is positioned at the upper left of the position P1 of the range determination marker 2b in the captured image, the position relationship judgment unit 33 judges that each of the range determination markers 2a and 2b is arranged in the position in which the display range RA can be specified. In a case where it is judged that the position P1 of the range determination marker 2 is not suitable, the processing proceeds to processing S15. In a case where it is judged that the position P1 of the range determination marker 2 is suitable, the processing proceeds to processing S16.

In a case where it is judged that the position P1 of the range determination marker 2 is not suitable in processing S14, the display control unit 25 allows the display unit 24 to display the captured image (processing S15). For example, in processing S15, the display information determination unit 52 determines that only the captured image is displayed on the display unit 24. The image creation unit 35 outputs only the captured image to the display unit 24 without creating the synthetic image in the synthesis unit 53. As a result thereof, the display unit 24 displays only the captured image. In a case where processing S15 ends, the marker detection processing ends, and a processing result is returned.

In a case where it is judged that the position P1 of the range determination marker 2 is suitable in processing S14, the display control unit 25 allows the display unit 24 to display the captured image and the display range RA (processing S16). In processing S16, the display range determination unit 32 determines the display range RA, based on the detection result of the range determination marker 2. For example, in processing S16, the display information determination unit 52 determines that the display range RA and the captured image are displayed on the display unit 24. The image creation unit 35 outputs the synthetic image in which the result image representing only the display range RA and the captured image are synthesized to the display unit 24. As a result thereof, as illustrated in FIG. 3, the display unit 24 displays the display range RA and the captured image. In a case where processing S16 ends, the marker detection processing ends, and the processing result is returned.

In a case where it is judged that there is the sensor marker 12 in processing S12, the marker position calculation unit 43 acquires the position P1 of the range determination marker 2 and the position P2 of the sensor marker 12 (processing S17). For example, the marker position calculation unit 43 calculates the position P1 of the range determination marker 2 in the captured image and the position P2 of the sensor marker 12 in the captured image, and outputs a calculation result to the position relationship judgment unit 33 and the storage unit 22. In processing S17, the marker position calculation unit 43 calculates the relative position between the range determination marker 2 and the sensor marker 12, based on the detection result of the range determination marker 2 and the detection result of the sensor marker 12. The position P2 of the sensor marker 12 is the position information relevant to the measurement position in which the measurement value is measured. In this embodiment, the position P2 of the sensor marker 12 is coincident with the measurement position.

In a case where the processing S17 ends, the position relationship judgment unit 33 judges whether or not the position between the range determination marker 2 and the sensor marker 12 is suitable (processing S18). For example, the position relationship judgment unit 33 judges whether or not the position relationship between the plurality of range determination markers 2a and 2b is suitable. For example, as with processing S14, in a case where each of the range determination markers 2a and 2b is arranged in the position in which the rectangular display range RA can be specified, the position relationship judgment unit 33 judges that the position relationship between the plurality of range determination markers 2a and 2b is suitable. In a case where it is judged that the position P1 of the range determination marker 2 is not suitable, the processing proceeds to processing S13. In a case where it is judged that the position P1 of the range determination marker 2 is suitable, the processing proceeds to processing S19.

In a case where it is judged that the position P1 of the range determination marker 2 is suitable in processing S18, it is judged whether or not the measurement position is positioned in the display range RA (processing S19). For example, in a case where the position P2 of the sensor marker 12 is positioned in the display range RA, the position relationship judgment unit 33 judges that the measurement position is positioned in the display range RA. In a case where it is judged that the measurement position is not positioned in the display range RA, the processing proceeds to processing S20. In a case where it is judged that the measurement position is positioned in the display range RA, the marker detection processing ends, and a processing result is returned.

In a case where it is judged that the measurement position is not positioned in the display range RA in processing S19, the display control unit 25 allows the display unit 24 to display the captured image, the display range RA, and the sensor position (processing S20). In processing S20, the display range determination unit 32 determines the display range RA, based on the detection result of the range determination marker 2. For example, in processing S20, the display information determination unit 52 determines that the display range RA, the captured image, and the sensor position are displayed on the display unit 24. For example, in processing S20, the display information determination unit 52 calculates the display range RA from the position P1 of the range determination marker 2 that is acquired in processing S17, and calculates the sensor position from the position P2 of the sensor marker 12 that is acquired in processing S17. The image creation unit 35 outputs the synthetic image in which the result image representing the display range RA and the sensor position, and the captured image are synthesized to the display unit 24. As a result thereof, as illustrated in FIG. 4, the display unit 24 displays the display range RA, the sensor position, and the captured image. In a case where processing S20 ends, the marker detection processing ends, and a processing result is returned.

In a case where it is judged that there is no range determination marker 2 in processing S11, it is judged whether or not there is the sensor marker 12 in the captured image (processing S21). For example, as with processing S12, the marker detection unit 42 performs the image detection of the feature point of the sensor marker 12 from the captured image. In processing S21, in a case where it is judged that there is the sensor marker 12, the processing proceeds to processing S22. In processing S21, in a case where it is judged that there is no sensor marker 12, the processing proceeds to processing S24.

In a case where it is judged that there is the sensor marker 12 in processing S21, the marker position calculation unit 43 acquires the position P2 of the sensor marker 12 (processing S22). For example, the marker position calculation unit 43 calculates the position P2 of the sensor marker 12 in the captured image, and outputs a calculation result to the display information determination unit 52 and the storage unit 22. In this embodiment, the position P2 of the sensor marker 12 is coincident with the measurement position.

In a case where processing S22 ends, the display control unit 25 allows the display unit 24 to display the captured image and the sensor position (processing S23). For example, in processing S23, the display information determination unit 52 determines that the captured image and the sensor position are displayed on the display unit 24. For example, in processing S23, the display information determination unit 52 calculates the sensor position from the position P2 of the sensor marker 12 that is acquired in processing S22. The image creation unit 35 outputs the synthetic image in which the result image representing only the sensor position and the captured image are synthesized to the display unit 24. In a case where processing S23 ends, the marker detection processing ends, and a processing result is returned.

In a case where it is judged that there is no sensor marker 12 in processing S21, the display control unit 25 allows the display unit 24 to display the captured image (processing S24). For example, in processing S24, the display information determination unit 52 determines that only the captured image is displayed on the display unit 24. The image creation unit 35 outputs only the captured image to the display unit 24 without creating the synthetic image in the synthesis unit 53. As a result thereof, the display unit 24 displays only the captured image. In a case where processing S24 ends, the marker detection processing ends, and a processing result is returned.

Figure 13:
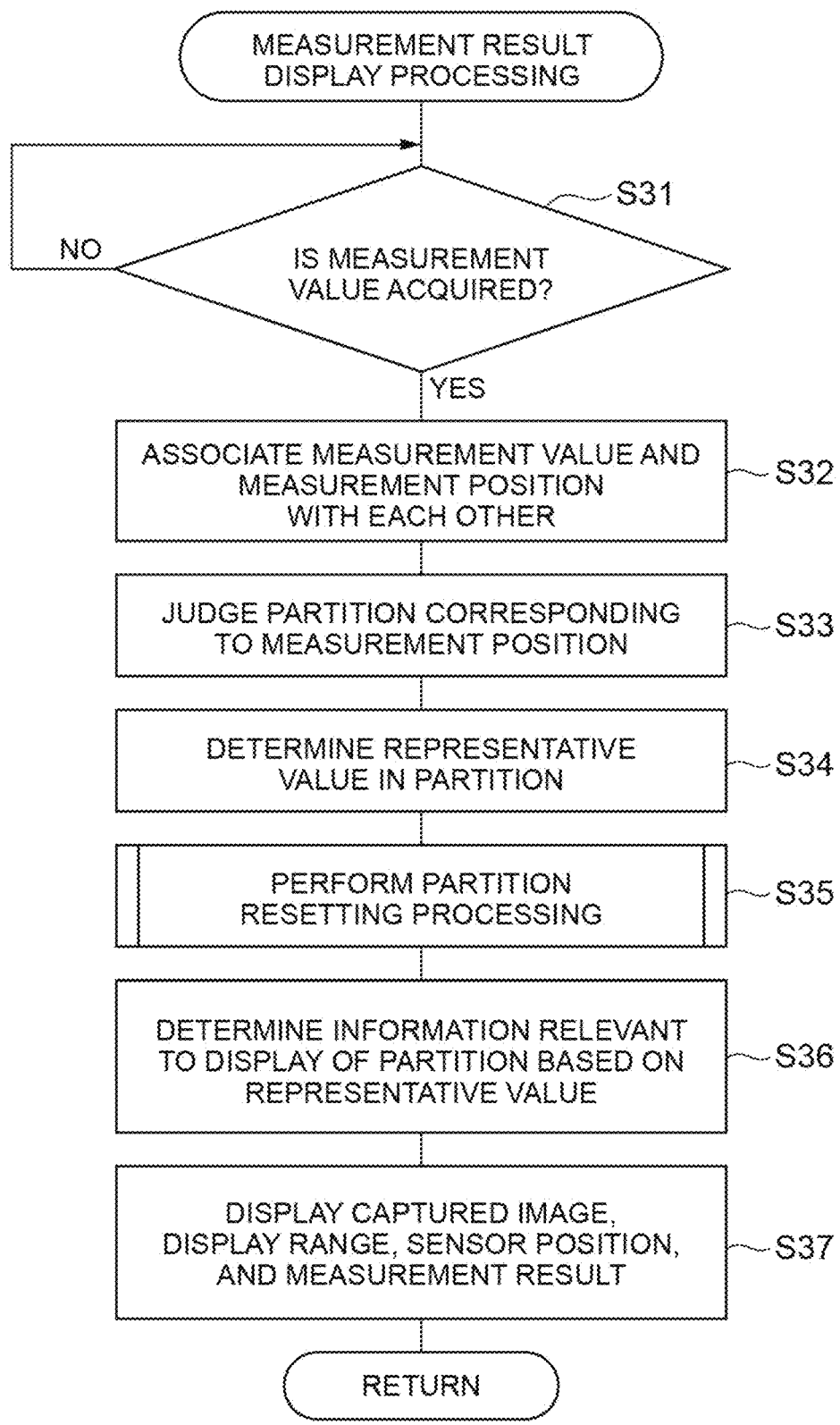
FIG. 13 is a flowchart illustrating measurement result display processing.

Next, the measurement result display processing in processing S6 will be described in detail. FIG. 13 is a flowchart illustrating the measurement result display processing.

First, it is judged whether or not the measurement information acquisition unit 34 acquires the measurement value (processing S31). In a case where the measurement value is acquired from the measurement processing unit 23, it is judged that the measurement information acquisition unit 34 acquires the measurement value. In a case where the measurement information acquisition unit 34 does not acquire the measurement value, processing S31 is repeated. In a case where the measurement information acquisition unit 34 acquires the measurement value, the processing proceeds to processing S32.

In a case where it is judged that the measurement value is acquired, the measurement information acquisition unit 34 associates the measurement value and the measurement position with each other (processing S32). The measurement information acquisition unit 34 acquires the measurement position that is acquired in processing S17 from the position information acquisition unit 31. The measurement information acquisition unit 34, for example, stores the measurement value and the measurement position, which are associated with each other, in the storage unit 22. The measurement information acquisition unit 34 outputs the measurement value and the measurement position, which are associated with each other, to the image creation unit 35. The measurement information acquisition unit 34 may acquire the measurement value and the measurement position, which are associated with each other, from the storage unit 22.

Next, the partition judgment unit 62 judges the partition PA corresponding to the measurement position (processing S33). The partition judgment unit 62 judges the partition PA corresponding to the measurement position of each of the measurement values in the plurality of partitions PA, based on the position information acquired in the position information acquisition unit 31. The plurality of partitions PA set in processing S33 are the partitions PA that are sectioned in accordance with the initial setting in processing S1. The partition setting unit 61 may section the display range RA when the initial setting is acquired in processing S1, or may section the display range RA before processing S33 or in processing S33.

In this embodiment, whenever one measurement value is acquired in the measurement processing unit 23, the partition judgment unit 62 judges the partition PA corresponding to the measurement position of the measurement value. As a modification example of this embodiment, for each of the plurality of measurement values stored in the storage unit 22, the partition PA corresponding measurement position of each of the measurement values may be judged at one time. The partition judgment unit 62, for example, stores a judgment result in the storage unit 22. The partition judgment unit 62 may output the judgment result to the display information determination unit 52.

Next, the display information determination unit 52 determines the representative value in the partition PA (processing S34). The display information determination unit 52 acquires the measurement value corresponding to the target partition PA from the partition judgment unit 62 or the storage unit 22. The display information determination unit 52, for example, determines the representative value, based on the measurement value corresponding to the partition PA. In a case where two or more measurement values measured at timings different from each other correspond to one partition PA, the display information determination unit 52 calculates and determines the representative value from the two or more measurement values.

Next, the partition processing unit 51 performs resetting processing of the partition PA (processing S35). In a case where the resetting judgment unit 63 judges to reset the plurality of partitions PA, the partition processing unit 51 resets the partition PA in the partition setting unit 61. In a case where a flag representing that a predetermined condition is satisfied in the processing of the electromagnetic environment analysis device 3 or that predetermined input is performed by the user is detected, the resetting judgment unit 63 resets the plurality of partitions PA.

Next, the display information determination unit 52 determines the information relevant to the display of the partition PA, based on the representative value (processing S36). In this embodiment, the display information determination unit 52 determines the color to be displayed in the partition PA, based on the representative value. For example, the display information determination unit 52 determines the color to be displayed in each of the partitions PA, in accordance with the size of the measurement value corresponding to each of the partitions PA. For example, the display information determination unit 52 determines a color corresponding to the size of the representative value corresponding to a certain partition PA, as the color to be displayed in the certain partition PA. In processing S36, the display information determination unit 52 may determine information other than the color, in accordance with the representative value of each of the partitions PA. The display information determination unit 52 stores the information relevant to the display of each of the partitions PA in the storage unit 22.

Next, the display control unit 25 allows the display unit 24 to display the captured image, the display range RA, the sensor position, and the measurement result (processing S37). In processing S37, the display range determination unit 32 determines the display range RA, based on the detection result of the range determination marker 2. The display control unit 25, for example, acquires information required for display from the storage unit 22. For example, the display information determination unit 52 determines that the captured image, the display range RA, the sensor position, and the measurement result are displayed on the display unit 24. For example, in processing S37, the display information determination unit 52 calculates the display range RA from the position P1 of the range determination marker 2 that is acquired in processing S17, and calculates the sensor position from the position P2 of the sensor marker 12 that is acquired in processing S17. The measurement result, for example, is represented by the color determined in processing S36. The image creation unit 35 outputs the synthetic image in which the result image representing the display range RA, the sensor position, and the measurement result, and the captured image are synthesized to the display unit 24. The measurement result is represented by displaying the information relevant to the measurement value in the position associated with the measurement position of each of the measurement values. As a result thereof, the display unit 24 displays the display range RA, the sensor position, the measurement result, and the captured image. In a case where processing S37 ends, the marker detection processing ends, and a processing result is returned.

In FIG. 5, the measurement positions P4 of two or more measurement values are positioned in one partition PA. Even in such a case, the representative value is calculated and determined in processing S33 and processing S34, and the information relevant to the display of the partition PA is determined based on the representative value, in processing S36. As a result thereof, in each of the partitions PA, a color corresponding to the representative value is displayed. In other words, even in a case where two or more measurement values measured at timings different from each other correspond to one partition PA, information based on the representative value is displayed.

Figure 14:
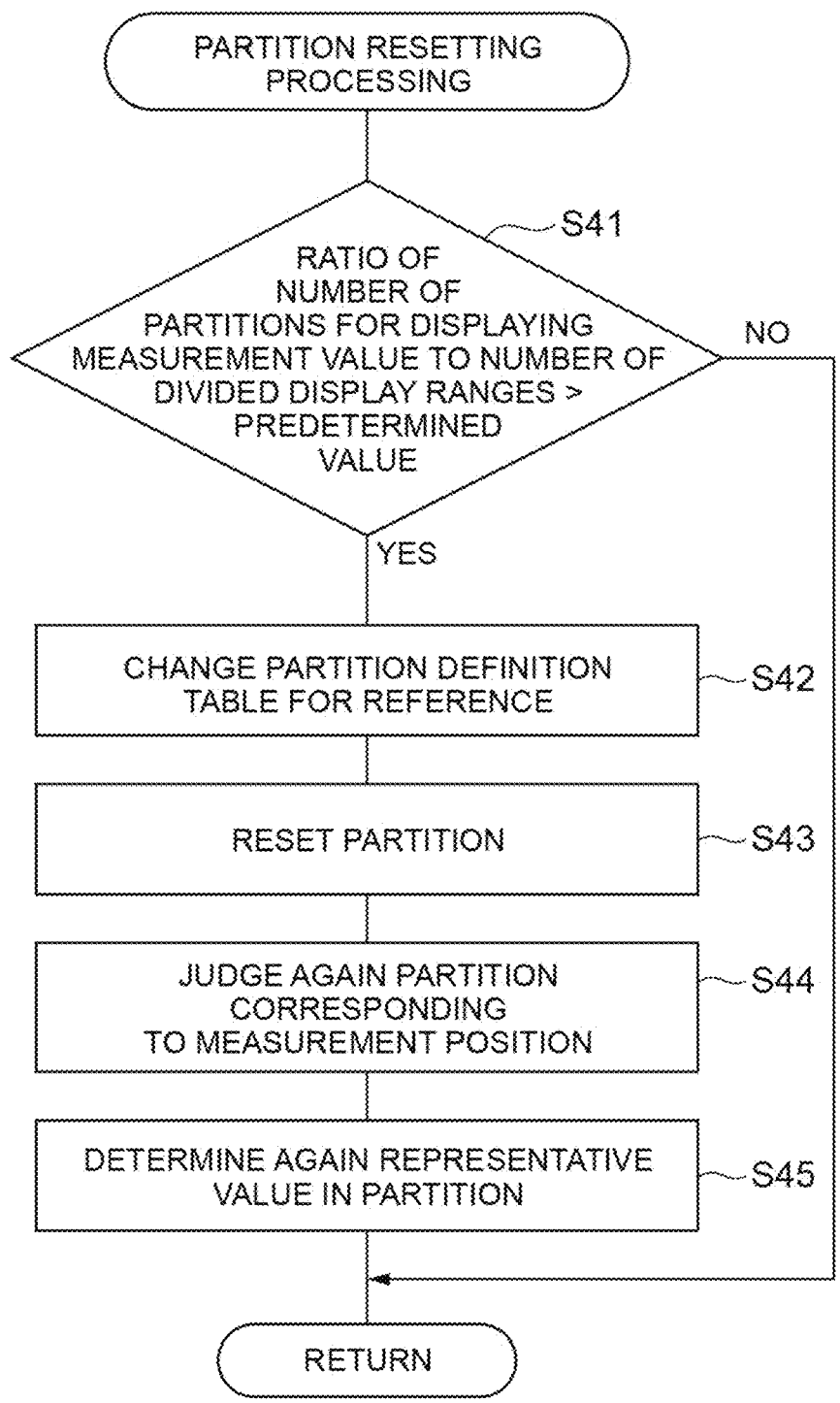
FIG. 14 is a flowchart illustrating an example of partition resetting processing.

Next, an example of the partition resetting processing in processing S35 will be described in detail. FIG. 14 is a flowchart illustrating an example of the partition resetting processing.

First, the resetting judgment unit 63 judges whether or not to reset the partition PA (processing S41). In this embodiment, the resetting judgment unit 63 judges whether or not a condition that a ratio of the number of partitions PA for displaying the measurement result to the number of divided display ranges RA is greater than a predetermined value is satisfied. The predetermined value is stored in the storage unit 22 along with the partition definition table. In a case where the ratio described above is not greater than the predetermined value, the partition resetting processing ends.

In a case where the ratio described above is greater than the predetermined value, the processing proceeds to processing S42.

In a case where the ratio described above is greater than the predetermined value, the partition setting unit 61 changes the partition definition table for reference (processing S42). The partition setting unit 61, for example, changes the partition definition table for reference from the partition definition table 71 illustrated in FIG. 6A to the partition definition table 72 illustrated in FIG. 6B. The number of sectioned display ranges RA in the partition definition table 72 is greater than the number of sectioned display ranges RA in the partition definition table 71. In a case where the partition definition table 71 corresponds to a first partition definition table, the partition definition table 72 corresponds to a second partition definition table.

Next, the partition setting unit 61 resets the plurality of partitions PA (processing S43). In processing S43, the partition setting unit 61 resets the plurality of partitions PA with reference to the partition definition table 72 changed in the processing S42. According to processing S42 and processing S43, the partition setting unit 61 resets the plurality of partitions PA such that the number of partitions PA forming the display range RA is changed. Accordingly, the partition setting unit 61 changes the size of each of the partitions PA. The partition setting unit 61, for example, resets the plurality of partitions PA forming the display range RA from the plurality of partitions PA1 illustrated in FIG. 7A to the plurality of partitions PA2 illustrated in FIG. 7B by changing the number of partitions PA forming the display range RA in processing S42 and processing S43. Each of the plurality of partitions PA2 has a size different from that of the partition PA1. In this embodiment, the size of each of the partitions PA2 is smaller than the size of each of the partitions PA1. As a result thereof, the partition PA to which the measurement position P4 of each of the measurement values is sorted is changed. For example, in FIG. 7A, the plurality of measurement positions P4 positioned in the same partition PA1 is divided into two partitions PA2 different from each other. In a case where the partition PA1 corresponds to a first partition, the partition PA2 corresponds to a second partition.

Next, the partition judgment unit 62 judges again the partition PA corresponding to the measurement position (processing S44). For example, the partition judgment unit 62 judges the partition PA2 corresponding to the measurement position in the plurality of partitions PA2 that are reset in processing S43. The partition judgment unit 62 judges the partition PA2 corresponding to the measurement position of each of the measurement values in the plurality of partitions PA2, based on the position information acquired in the position information acquisition unit 31. The partition judgment unit 62, for example, stores a judgment result in the storage unit 22. The partition judgment unit 62 may output the judgment result to the display information determination unit 52.

Next, the display information determination unit 52 determines again the representative value in the partition PA (processing S45). In a case where processing S45 ends, the partition resetting processing ends. For example, the display information determination unit 52 determines the representative value corresponding to each of the plurality of partitions PA2 that are reset in processing S43. The display information determination unit 52 acquires the measurement value corresponding to the target partition PA2 from the partition judgment unit 62 or the storage unit 22. The display information determination unit 52, for example, determines the representative value, based on the measurement value corresponding to the partition PA2. In a case where two or more measurement values measured at timings different from each other correspond to one partition PA2, the display information determination unit 52 calculates and determines the representative value from the two or more measurement values. In this case, in processing S36 after processing S45, the display information determination unit 52 determines the information relevant to the display of the partition PA2, based on the representative value calculated in processing S45.

As described above, an example of the measurement method using the electromagnetic environment analysis system has been described, but the order of each processing is not limited to the above. For example, processing S1 may be executed at any time insofar as processing S1 is after processing S2 and before processing S6. Processing S1 may be performed in the middle of processing S6 insofar as processing S1 is executed before processing S33. In a case where the resetting judgment unit 63 judges the resetting of the partition PA, in accordance with the input manipulation of the user, processing S35 may be executed at any time insofar as processing S35 is after processing S1 and before processing S36.

In processing S31, the information relevant to the electromagnetic environment is acquired from the sensor 11, and the plurality of measurement values are acquired based on the acquired information. The sensor 11 sequentially detects the information relevant to the electromagnetic environment. In this embodiment, in processing S31, the plurality of measurement values relevant to the electromagnetic environment are acquired by repeating processing S3 to processing S7. The image capturing unit 21 sequentially captures the images of the real space, and the captured image acquisition unit 41 acquires the captured images that are sequentially captured in the image capturing unit 21. In a case where the plurality of measurement values are output from the measurement processing unit 23 during one loop of processing S3 to processing S7, the plurality of measurement values are acquired in one processing S31.

Next, an example of resetting the partition in the electromagnetic environment analysis system 1 will be described in more detail with reference to FIG. 15 to FIG. 18. In FIG. 15 to FIG. 18, a difference in color is represented by a difference in hatching.

Figure 15:
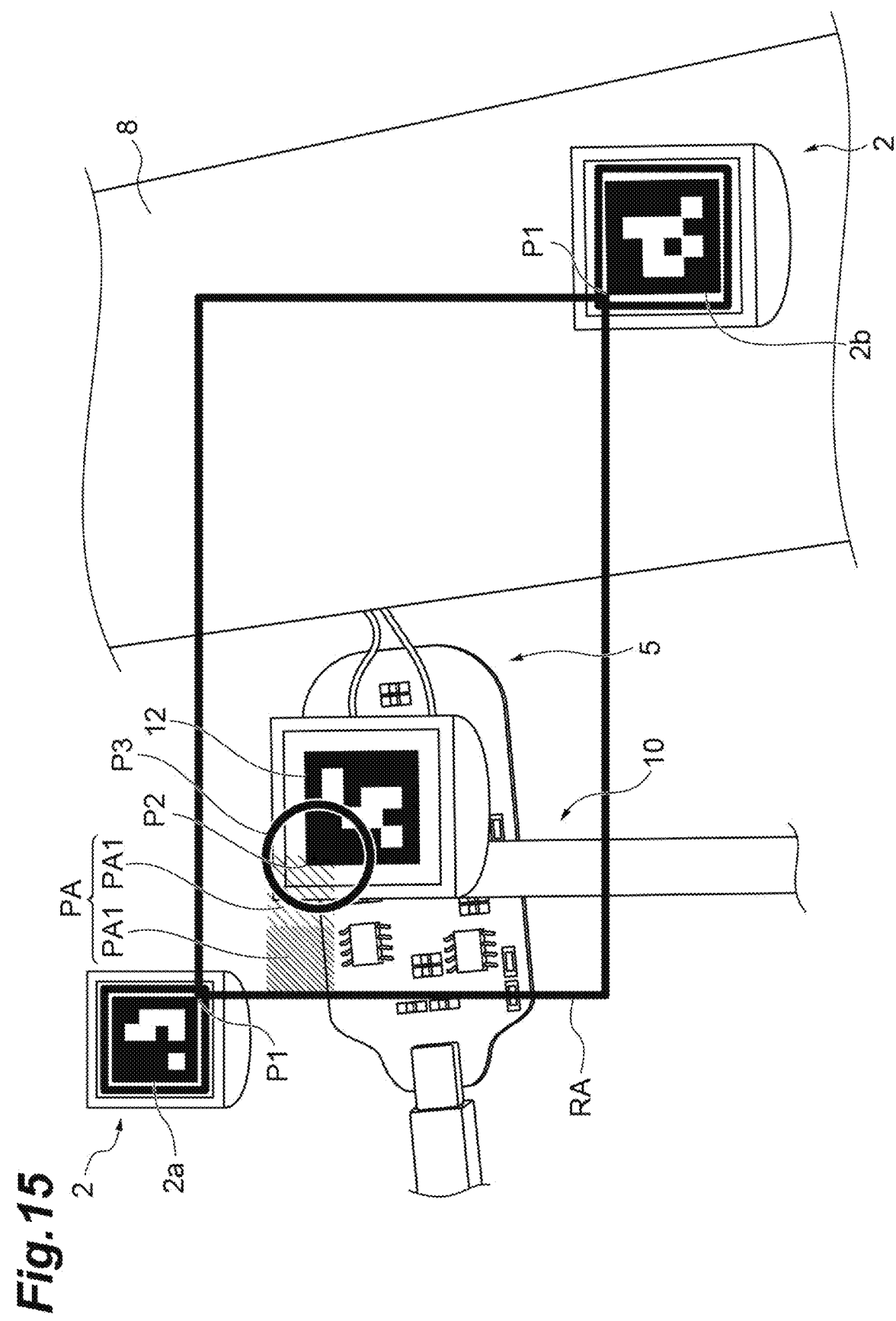
FIG. 15 is a diagram for describing an operation of resetting the partition.

In FIG. 15, information according to the measurement value is displayed in each of the partitions PA1 forming the display range RA by executing processing S31 to processing S37. In this embodiment, each of the partitions PA1 is color-coded in accordance with the measurement value. In the display range RA, the partition PA1 that is not hatched is a portion in which the measurement is not performed.

Figure 16:
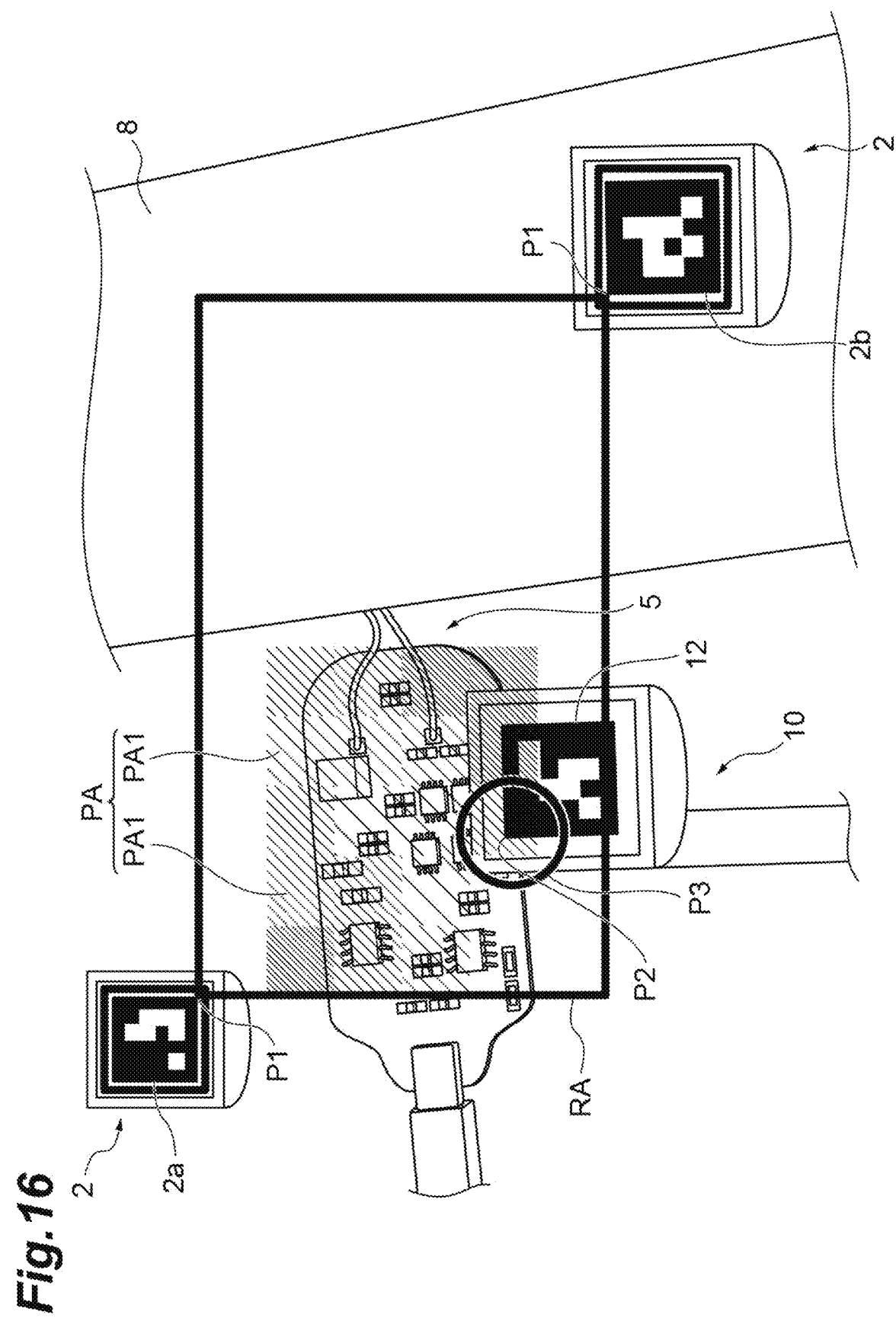
FIG. 16 is a diagram for describing the operation of resetting the partition.

The manipulation unit 10 is moved from the state illustrated in FIG. 15, and processing S3 to processing S7 are repeated. The measurement is also repeated along with the movement of the manipulation unit 10. Accordingly, the partition PA1 in which the measurement is performed increases. As a result thereof, as illustrated in FIG. 16, the partition PA1 in which the information according to the measurement value is displayed increases. In other words, the partition PA1 in which a color is displayed increases.

Figure 17:
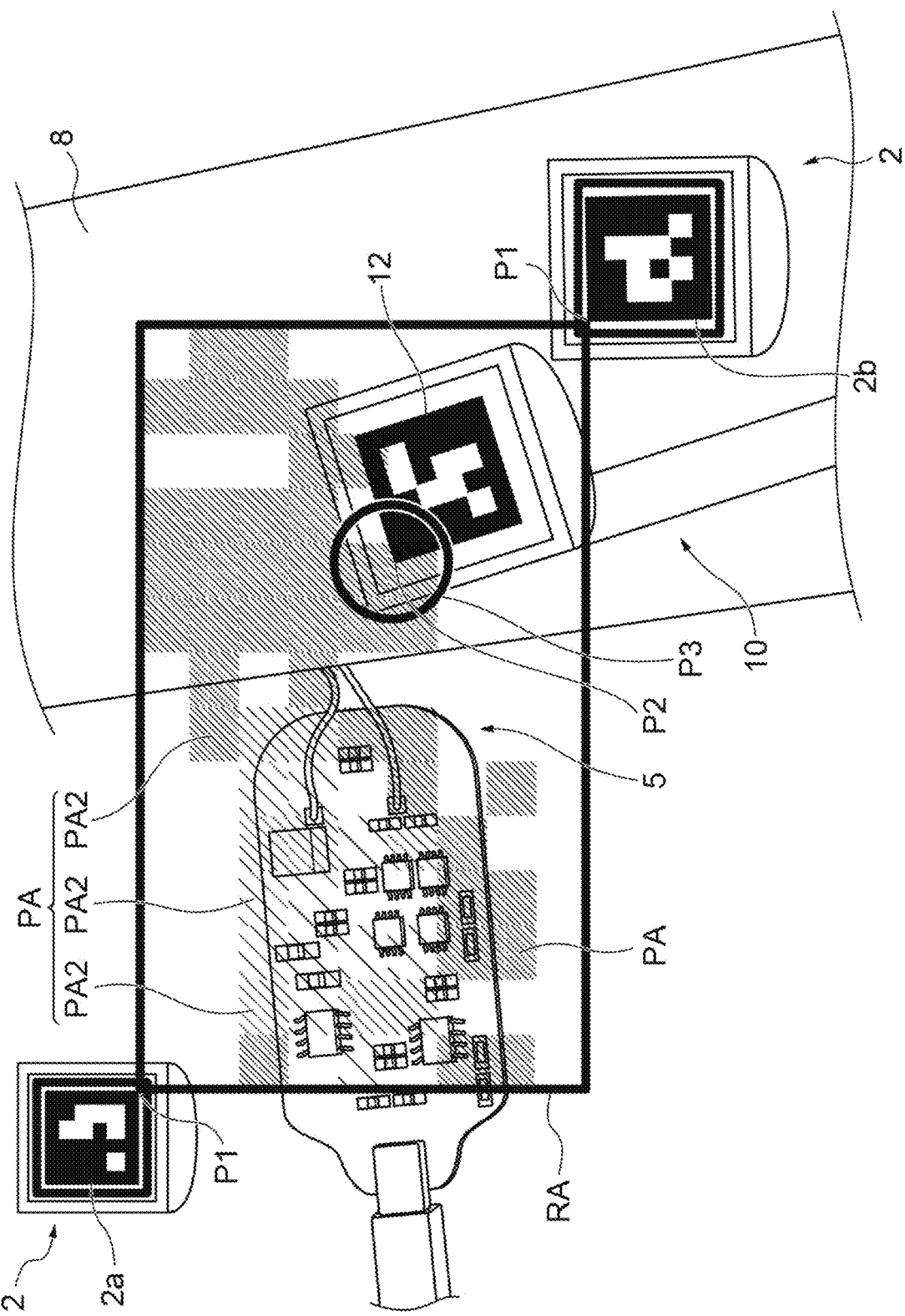
FIG. 17 is a diagram for describing the operation of resetting the partition.

Further, since the measurement is repeated along with the movement of the manipulation unit 10 from the state illustrated in FIG. 16, a ratio of the number of partitions PA1 in which the measurement result is displayed to the number of divided display ranges RA is greater than a first predetermined value. By satisfying such a condition, it is judged that the partition PA is reset in processing S41, and processing S42 to processing S45, processing S36, and processing S37 are executed. In processing S43, the partition definition table is changed from the partition definition table 71 to the partition definition table 72. As a result thereof, as illustrated in FIG. 17, the plurality of partitions PA forming the display range RA are reset from the plurality of partitions PA1 to the plurality of partitions PA2. The size of each of the partitions PA2 is smaller than the size of each of the partitions PA1. The number of partitions PA forming the display range RA increases from the state illustrated in FIG. 16. In other words, the display range RA is more finely sectioned from the state illustrated in FIG. 16. The representative value in the plurality of partitions PA2 is determined by processing S44 and processing S45, and the display in the display range RA is updated from display based on the plurality of partitions PA1 to display based on the plurality of partitions PA2 by processing S36 and processing S37.

Figure 18:
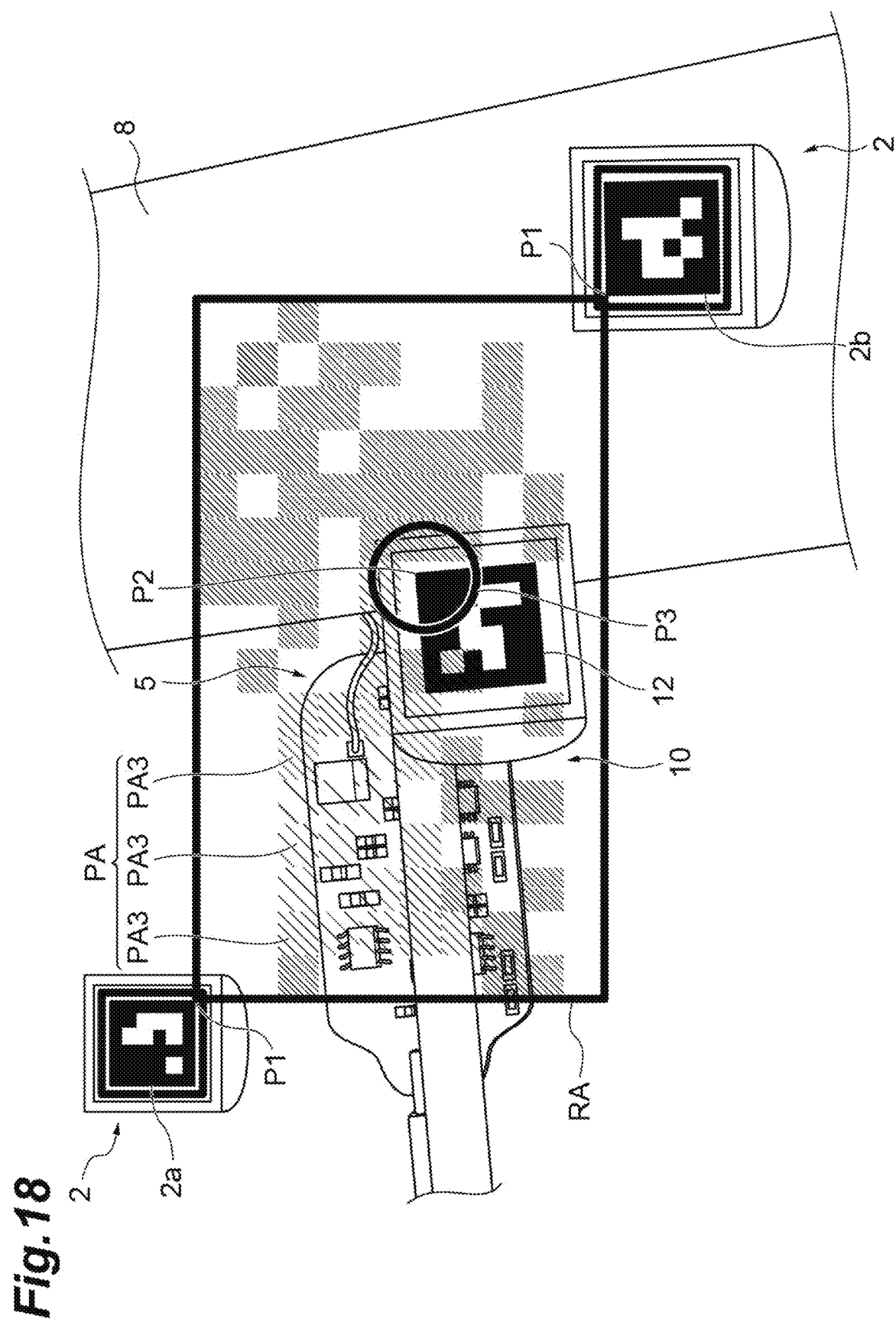
FIG. 18 is a diagram for describing the operation of resetting the partition.

Further, since the measurement is repeated along with the movement of the manipulation unit 10 from the state illustrated in FIG. 17, a ratio of the number of partitions PA2 in which the measurement result is displayed to the number of divided display ranges RA is greater than a second predetermined value. The second predetermined value and the first predetermined value are the same. The second predetermined value and the first predetermined value may be different from each other. By satisfying such a condition, it is judged again that the partition PA is reset in processing S41, and processing S42 to processing S45, processing S36, and processing S37 are executed. As a result thereof, as illustrated in FIG. 18, the plurality of partitions PA forming the display range RA is reset from the plurality of partitions PA2 to a plurality of partitions PA3. The size of each of the partitions PA3 is smaller than the size of each of the partitions PA2. The number of partitions PA forming the display range RA increases from the state illustrated in FIG. 17. In other words, the display range RA is more finely sectioned from the state illustrated in FIG. 17. The representative value in the plurality of partitions PA3 is determined by processing S44 and processing S45, and the display in the display range RA is updated from the display based on the plurality of partitions PA2 to display based on the plurality of partitions PA3 by processing S36 and processing S37.

Next, a function effect of the electromagnetic environment analysis system in this embodiment will be described. In the electromagnetic environment analysis system 1, the resetting judgment unit 63 judges whether or not to reset the plurality of partitions PA. In a case where the resetting judgment unit 63 judges to reset the plurality of partitions PA, the partition setting unit 61 resets the plurality of partitions PA forming the display range RA to the plurality of partitions PA2 smaller than the partition PA1. In this case, the display information determination unit 52 determines the information relevant to the display of the partition PA2. Accordingly, the size of the plurality of partitions PA forming the display range RA can be changed during the measurement of the display range RA. Therefore, the definition of the display can be changed in accordance with the measurement situation. As a result thereof, desired measurement can be easily attained.

The size of each of the partitions PA2 is smaller than the size of each of the partitions PA1. In this case, the definition of the display can be in a high state from a low state during the measurement of the display range RA. Accordingly, the electromagnetic environment analysis system 1 is capable of displaying the measurement result in the broad position in the initial step of the measurement, and then, displaying the detailed measurement result for the desired position.

In a case where the resetting judgment unit 63 judges to reset the plurality of partitions PA, the partition judgment unit 62 judges the partition PA2 corresponding to the measurement position of each of the measurement values in the plurality of partitions PA2, based on the position information, and the display information determination unit 52 determines the information relevant to the display of the partition PA2, based on the measurement value corresponding to the partition PA2. In this case, since the measurement value corresponding to the partition PA2 is judged again, more accurate display can be attained in the partition PA2.

In a case where at least one of the plurality of conditions is satisfied, the resetting judgment unit 63 judges to reset the plurality of partitions PA. The size of each of the partitions PA2 reset by the partition setting unit 61 in a case where the first condition of the plurality of conditions is satisfied is smaller than the size of each of the partitions PA2 reset by the partition setting unit 61 in a case where the second condition of the plurality of conditions is satisfied. In this case, the plurality of partitions PA of the display range RA are reset to the partitions PA2 having different sizes, in accordance with the condition. Accordingly, desired measurement can be more easily attained.

The second condition is a condition that is satisfied before the first condition is satisfied. In this case, the size of the plurality of partitions PA forming the display range RA is reset by satisfying the second condition, and then, the size of the plurality of partitions PA forming the display range RA is further reduced by satisfying the first condition. Therefore, the definition of the display can be changed at a multi-stage, in accordance with the measurement situation.

The electromagnetic environment analysis system 1 may further include the storage unit 22 storing the plurality of partition definition tables 71 and 72 for defining the configurations of each of the partitions PA in cases where the display range RA is sectioned to the numbers different from each other. The partition setting unit 61 sets the plurality of partitions PA, based on the plurality of partition definition tables 71 and 72. In this case, the definition of the display can be more easily changed by the partition definition tables 71 and 72, without any special calculation processing.

The resetting judgment unit 63 judges to reset the plurality of partitions PA, in accordance with the input manipulation of the user. In this case, the plurality of partitions PA can be reset at an arbitrary timing.

In a case where the number of partitions PA corresponding to the measurement value is greater than the predetermined number, the resetting judgment unit 63 judges to reset the plurality of partitions PA. In this case, the plurality of partitions PA can be automatically reset.

In a case where the ratio of the number of partitions PA corresponding to the measurement value to the number of sectioned display ranges RA is greater than the predetermined value, the resetting judgment unit 63 judges to reset the plurality of partitions PA. In this case, the plurality of partitions PA can be automatically reset by simpler setting.

In a case where the number of times of the resetting of the plurality of partitions PA is greater than the predetermined number, the resetting judgment unit 63 inhibits the resetting of the plurality of partitions PA. In this case, a situation in which the resetting is performed more than necessary can be avoided. As a result thereof, detailed measurement in a desired position can be more easily attained.

In a case where two or more measurement values measured at timings different from each other correspond to one partition PA, the electromagnetic environment analysis system 1 calculates the representative value from the two or more measurement values, and determines the information relevant to the display of the partition PA, based on the representative value. As described above, since the electromagnetic environment analysis system 1 performs two-step processing of the calculation of the representative value and the determination of the display information based on the representative value, even in a case where there are the plurality of measurement values in one partition PA, it is possible to display a suitable measurement result for each of the partitions PA. For example, unless the movement of the sensor 11 and the measurement of the sensor 11 are synchronized with each other, the measurement value and the partition PA are not necessarily in a one-to-one relationship. In consideration of a measurement error, there is also a demand for performing the measurement a plurality of times in one partition PA. As described above, even in the case of a device configuration in which a timing at which the measurement is performed and a position in which the measurement is performed are not synchronized with each other or even in a case where the measurement is performed a plurality of times in one partition PA, the electromagnetic environment analysis system 1 is capable of displaying a suitable measurement result for each of the partitions.

The measurement information acquisition unit 34 acquires the additional information corresponding to each of the measurement values. The additional information includes at least one of the information relevant to the intensity of the electromagnetic wave, the information relevant to the phase of the electromagnetic wave, the information relevant to the frequency component of the electromagnetic wave, and the information relevant to the timing at which the measurement is performed. The display information determination unit 52 calculates the representative value from the two or more measurement values included in one partition PA, based on the additional information. In this case, a more suitable representative value can be calculated from the two or more measurement values.

The plurality of measurement values may include the plurality of measurement values relevant to the electromagnetic waves of the frequency components different from each other. In this case, the display information determination unit 52 selects at least one measurement value from the two or more measurement values, based on the frequency component, and calculates the representative value from the at least one selected measurement value. As a result thereof, in a case where there are two or more measurement values in one partition PA, a suitable measurement result relevant to an electromagnetic wave of a desired frequency component can be displayed.

The plurality of measurement values may include the plurality of first measurement values relevant to the electromagnetic wave of the first frequency component and the plurality of second measurement values relevant to the electromagnetic wave of the second frequency component. In this case, the display information determination unit 52 determines the first information relevant to the display of the partition PA, based on the first measurement value corresponding to the partition PA, and determines the second information relevant to the display of the partition PA, based on the second measurement value corresponding to each of the partitions PA. In a case where two or more first measurement values measured at timings different from each other correspond to one partition PA, the display information determination unit calculates the first representative value from the two or more first measurement values, and determines the first information relevant to the display of the partition PA, based on the first representative value. As a result thereof, a suitable measurement result can be displayed in each of the partitions PA for each of the electromagnetic waves of different frequency components.

The display information determination unit 52 determines the information relevant to the display of the partition PA by using the maximum value, the minimum value, the medium value, or the mode value in the two or more measurement values included in one partition PA, as the representative value. In this case, a desired measurement value can be the representative value. For example, a measurement result can be more accurately displayed, compared to the case of simply updating the measurement values in the same partition PA.

The display information determination unit 52 may calculate the average value of the two or more measurement values included in one partition PA, and may determine the information relevant to the display of the partition PA by using the calculated average value as the representative value. Even in this case, a desired measurement value can be the representative value.

The image creation unit 35 further includes the resetting judgment unit 63 that judges whether or not to reset the plurality of partitions PA forming the display range RA. In a case where the resetting judgment unit 63 judges to reset the plurality of partitions PA, the partition setting unit 61, the partition judgment unit 62, and the display information determination unit 52 perform the following processing. The partition setting unit 61 resets the plurality of partitions PA forming the display range RA from the plurality of partitions PA1 to the plurality of partitions PA2, each of which has a size different from the size of the partition PA1. The partition judgment unit 62 judges the partition PA2 corresponding to the measurement position P4 of each of the measurement values in the plurality of partitions PA2, based on the position information acquired in the position information acquisition unit 31. The display information determination unit 52 may determine the information relevant to the display of the partition PA2, based on the measurement value corresponding to the partition PA2. In a case where two or more measurement values measured at timings different from each other correspond to one partition PA2, the display information determination unit calculates the representative value from the two or more measurement values, and determines the information relevant to the display of the partition PA2, based on the calculated representative value. In this case, the size of the partition PA can be changed in accordance with a measurement situation. Even in a case where the size of the partition PA is changed, a suitable measurement result is displayed for each of the partitions PA.

The embodiment and the modification examples of the present invention have been described above, but the present invention is not limited to the embodiment described above, and various changes can be made within a range not departing from the gist thereof.

In this embodiment, the position P2 of the sensor marker 12, that is, the measurement position is acquired by performing the image recognition with respect to the sensor marker 12. However, an acquisition method of the measurement position is not limited thereto. For example, a motion sensor may be built in at least one of the manipulation unit 10 and the image capturing unit 21. The motion sensor, for example, includes an acceleration sensor, a gyroscope sensor, a direction sensor, and the like.

What is claimed is:

1. An electromagnetic environment analysis system, comprising:
a storage configured to store a plurality of partition definition tables for defining configurations of each of a plurality of partitions when a display range is sectioned to numbers different from each other; and
a processor configured to:
acquire a plurality of measurement values relevant to an electromagnetic environment;
acquire position information relevant to a measurement position in which each of the measurement values is measured; and
create an image for displaying information relevant to the measurement value in a position associated with the measurement position of each of the measurement values, by:
setting the plurality of partitions forming the display range of the information relevant to the measurement value in the image, based on the plurality of partition definition tables;
judging the partition corresponding to the measurement position of each of the measurement values in the plurality of partitions, based on the position information;
determining information relevant to display of the partition, based on the measurement value corresponding to the partition;
judging whether or not to reset the plurality of partitions;
when the processor judges to reset the plurality of partitions:
resetting the plurality of partitions forming the display range from a plurality of first partitions to a plurality of second partitions, each of which has a size different from a size of the first partition; and
determining information relevant to display of the second partition; and
when a number of partitions corresponding to the measurement value is greater than a predetermined number:
judging to reset the plurality of partitions; and
resetting the plurality of partitions based on the plurality of partition definition tables.

2. The electromagnetic environment analysis system according to claim 1,
wherein the size of each of the second partitions is smaller than the size of each of the first partitions.

3. The electromagnetic environment analysis system according to claim 1, wherein when the processor judges to reset the plurality of partitions,
the processor judges the second partition corresponding to the measurement position of each of the measurement values in the plurality of second partitions, based on the position information, and
the processor determines the information relevant to the display of the second partition, based on the measurement value corresponding to the second partition.

4. The electromagnetic environment analysis system according to claim 1,
wherein when at least one of a plurality of conditions is satisfied, the processor judges to reset the plurality of partitions, and
the size of each of the second partitions reset by the processor when a first condition is satisfied in the plurality of conditions is smaller than the size of each of the second partitions reset by the processor when a second condition is satisfied in the plurality of conditions.

5. The electromagnetic environment analysis system according to claim 4,
wherein the second condition is a condition that is satisfied before the first condition is satisfied.

6. The electromagnetic environment analysis system according to claim 1,
wherein the processor judges to reset the plurality of partitions, in accordance with an input manipulation of a user.

7. The electromagnetic environment analysis system according to claim 1,
wherein when a ratio of the number of partitions corresponding to the measurement value to a number of sectioned display ranges is greater than a predetermined value, the processor judges to reset the plurality of partitions.

8. The electromagnetic environment analysis system according to claim 1,
wherein when a number of times of resetting of the plurality of partitions is greater than a predetermined number, the processor inhibits the resetting of the plurality of partitions.

9. The electromagnetic environment analysis system according to claim 1, further comprising:
a moveable piece including a sensor sequentially detecting information relevant to the electromagnetic environment, the moveable piece being manipulated by the user,
wherein the processor acquires the plurality of measurement values, based on the information detected in the sensor.

10. The electromagnetic environment analysis system according to claim 1, further comprising:
a display configured to display the image created by the processor.

11. An electromagnetic environment analysis method, comprising:
acquiring a plurality of measurement values relevant to an electromagnetic environment;
acquiring position information relevant to a measurement position in which each of the measurement values is measured;
storing a plurality of partition definition tables for defining configurations of each of a plurality of partitions when a display range is sectioned to numbers different from each other; and
creating an image for displaying information relevant to the measurement value in a position associated with the measurement position of each of the measurement values, by:
setting the plurality of partitions forming the display range of the information relevant to the measurement value in the image, based on the plurality of partition definition tables;
judging a partition corresponding to the measurement position of each of the measurement values in the plurality of partitions based on the position information;
determining information relevant to display of the partition based on the measurement value corresponding to the partition;
judging whether or not to reset the plurality of partitions;

when it is judged to reset the plurality of partitions;
  resetting the plurality of partitions forming the display range from a plurality of first partitions to a plurality of second partitions, each of which has a size different from a size of the first partition; and
  determining information relevant to display of the second partition is determined; and
when a number of partitions corresponding to the measurement value is greater than a predetermined number:
  judging to reset the plurality of partitions; and
  resetting the plurality of partitions based on the plurality of partition definition tables.

12. A non-transitory computer-readable medium storing a program causing a computer to execute:
  acquiring a plurality of measurement values relevant to an electromagnetic environment;
  acquiring position information relevant to a measurement position in which each of the measurement values is measured;
  storing a plurality of partition definition tables for defining configurations of each of a plurality of partitions when a display range is sectioned to numbers different from each other; and
  creating an image for displaying information relevant to the measurement value in a position associated with the measurement position of each of the measurement values, by:
    setting the plurality of partitions forming a display range of the information relevant to the measurement value in the image, based on the plurality of partition definition tables;
    judging a partition corresponding to the measurement position of each of the measurement values in the plurality of partitions based on the position information;
    determining information relevant to display of the partition based on the measurement value corresponding to the partition;
    judging whether or not to reset the plurality of partitions;
    when it is judged to reset the plurality of partitions:
      resetting the plurality of partitions forming the display range are reset from a plurality of first partitions to a plurality of second partitions, each of which has a size different from a size of the first partition and
      determining information relevant to display of the second partition is determined; and
    when a number of partitions corresponding to the measurement value is greater than a predetermined number:
      judging to reset the plurality of partitions; and
      resetting the plurality of partitions based on the plurality of partition definition tables.

13. An electromagnetic environment analysis system, comprising:
  a storage configured to store a plurality of partition definition tables for defining configurations of each of a plurality of partitions when a display range is sectioned to numbers different from each other; and
  a processor configured to:
    acquire a plurality of measurement values relevant to an electromagnetic environment;
    acquire position information relevant to a measurement position in which each of the measurement values is measured; and
    create an image for displaying information relevant to the measurement value in a position associated with the measurement position of each of the measurement values, by:
      setting the plurality of partitions forming the display range of the information relevant to the measurement value in the image, based on the plurality of partition definition tables;
      judging the partition corresponding to the measurement position of each of the measurement values in the plurality of partitions, based on the position information;
      determining information relevant to display of the partition, based on the measurement value corresponding to the partition;
      judging whether or not to reset the plurality of partitions;
    when the processor judges to reset the plurality of partition:
      resetting the plurality of partitions forming the display range from a plurality of first partitions to a plurality of second partitions, each of which has a size different from a size of the first partition; and
      determining information relevant to display of the second partition; and
    when a ratio of a number of partitions corresponding to the measurement value to a number of sectioned display ranges is greater than a predetermined value:
      judging to reset the plurality of partitions; and
      resetting the plurality of partitions based on the plurality of partition definition tables.

14. An electromagnetic environment analysis method, comprising:
  acquiring a plurality of measurement values relevant to an electromagnetic environment;
  acquiring position information relevant to a measurement position in which each of the measurement values is measured;
  storing a plurality of partition definition tables for defining configurations of each of a plurality of partitions when a display range is sectioned to numbers different from each other; and
  creating an image for displaying information relevant to the measurement value in a position associated with the measurement position of each of the measurement values, by:
    setting the plurality of partitions forming the display range of the information relevant to the measurement value in the image, based on the plurality of partition definition tables;
    judging a partition corresponding to the measurement position of each of the measurement values in the plurality of partitions based on the position information;
    determining information relevant to display of the partition based on the measurement value corresponding to the partition, and whether or not to reset the plurality of partitions is judged;
    when it is judged to reset the plurality of partitions:
      resetting the plurality of partitions forming the display range from a plurality of first partitions to a plurality of second partitions, each of which has a size different from a size of the first partition; and
      determining information relevant to display of the second partition; and when a ratio of the number of partitions corresponding to the measurement value to the number of sectioned display ranges is greater than a predetermined value:
judging to reset the plurality of partitions; and
resetting the plurality of partitions based on the plurality of partition definition tables.

15. A non-transitory computer-readable medium storing a program causing a computer to execute:
acquiring a plurality of measurement values relevant to an electromagnetic environment;
acquiring position information relevant to a measurement position in which each of the measurement values is measured;
storing a plurality of partition definition tables for defining configurations of each of a plurality of partitions when a display range is sectioned to numbers different from each other,
creating an image for displaying information relevant to the measurement value in a position associated with the measurement position of each of the measurement values, by:
setting the plurality of partitions forming a display range of the information relevant to the measurement value in the image, based on the plurality of partition definition tables;
judging a partition corresponding to the measurement position of each of the measurement values in the plurality of partitions based on the position information;
determining information relevant to display of the partition based on the measurement value corresponding to the partition;
judging whether or not to reset the plurality of partitions;
when it is judged to reset the plurality of partitions:
resetting the plurality of partitions forming the display range from a plurality of first partitions to a plurality of second partitions, each of which has a size different from a size of the first partition; and
determining information relevant to display of the second partition; and
when a ratio of the number of partitions corresponding to the measurement value to the number of sectioned display ranges is greater than a predetermined value:
judging to reset the plurality of partitions; and
resetting the plurality of partitions based on the plurality of partition definition tables.

* * * * *